United States Patent
Kondo et al.

(10) Patent No.: US 9,484,443 B2
(45) Date of Patent: Nov. 1, 2016

(54) SEMICONDUCTOR DEVICE

(71) Applicant: KABUSHIKI KAISHA TOSHIBA, Minato-Ku, Tokyo (JP)

(72) Inventors: Yoshiyuki Kondo, Yokohama (JP); Masakazu Goto, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 82 days.

(21) Appl. No.: 14/172,597

(22) Filed: Feb. 4, 2014

(65) Prior Publication Data

US 2015/0129925 A1 May 14, 2015

(30) Foreign Application Priority Data

Nov. 12, 2013 (JP) .................. 2013-234357

(51) Int. Cl.
- H01L 29/66 (2006.01)
- H01L 29/739 (2006.01)
- H01L 29/78 (2006.01)
- H01L 29/08 (2006.01)

(52) U.S. Cl.
CPC ..... *H01L 29/7391* (2013.01); *H01L 29/66356* (2013.01)

(58) Field of Classification Search
USPC ....................................... 257/105
See application file for complete search history.

(56) References Cited

U.S. PATENT DOCUMENTS

| | | | |
|---|---|---|---|
| 5,576,569 A * | 11/1996 | Yang | H01L 21/28273 257/316 |
| 8,026,509 B2 | 9/2011 | Goel et al. | |
| 2008/0224210 A1 * | 9/2008 | Cai | H01L 21/823412 257/338 |
| 2008/0311717 A1 * | 12/2008 | Bulucea | 438/290 |
| 2012/0061761 A1 * | 3/2012 | Makiyama | H01L 21/823814 257/355 |
| 2012/0199917 A1 | 8/2012 | Morooka | |

(Continued)

FOREIGN PATENT DOCUMENTS

JP 2013-089618 A 5/2013

OTHER PUBLICATIONS

Choi et al, "Tunneling Field-Effect Transistors (TFETs) With Sub-threshold Swing (SS) Less Than 60 mV/dec", IEEE Electron Device Letters, vol. 28, No. 8, Aug. 2007, pp. 743-745 (in English).

(Continued)

*Primary Examiner* — Zandra Smith
*Assistant Examiner* — Lawrence Tynes, Jr.
(74) *Attorney, Agent, or Firm* — Holtz, Holtz & Volek PC

(57) ABSTRACT

A semiconductor device includes a semiconductor layer opposing to a bottom surface and a side surface of a gate electrode. An insulation film is provided between the bottom surface of the gate electrode and the semiconductor layer and between the side surface of the gate electrode and the semiconductor layer. A first conduction-type drain layer is provided in the semiconductor layer on a side of an end part of one of the bottom surface and the side surface of the gate electrode. A second conduction-type source layer is provided in the semiconductor layer opposing to the other one of the bottom surface and the side surface of the gate electrode. A second conduction-type extension layer is provided in the semiconductor layer opposing to a corner part between the side surface and the bottom surface of the gate electrode and has a lower impurity concentration than that of the source layer.

12 Claims, 24 Drawing Sheets

(56) References Cited

U.S. PATENT DOCUMENTS

| | | |
|---|---|---|
| 2012/0228701 A1 | 9/2012 | Sasaki |
| 2012/0228706 A1 | 9/2012 | Sugizaki et al. |
| 2012/0319167 A1* | 12/2012 | van Dal .......... H01L 21/823807 257/192 |
| 2013/0134504 A1 | 5/2013 | Kondo et al. |
| 2014/0054657 A1* | 2/2014 | Hokazono et al. ........... 257/288 |
| 2014/0217519 A1* | 8/2014 | Qin .................... H01L 29/7833 257/408 |

OTHER PUBLICATIONS

Kim et al, "Design Guideline of Si-Based L-Shaped Tunneling Field-Effect Transistors", Japanese Journal of Applied Physics 51, (2012), pp. 06F09-1-06F09-4 (in English).

Morita et al, "Tunnel Field Effect Transistor with Epitaxially Grown Steep Tunnel Junction Fabricated by Source/Drain-first and Tunnel-junction-last Processes", Extended Abstracts of the 2012 International Conference on Solid State Devices and Materials, Kyoto 2012, pp. 801-802 (in English).

\* cited by examiner

US 9,484,443 B2

SEMICONDUCTOR DEVICE

CROSS REFERENCE TO RELATED APPLICATIONS

This application is based upon and claims the benefit of priority from the prior Japanese Patent Application No. 2013-234357, filed on Nov. 12, 2013, the entire contents of which are incorporated herein by reference.

FIELD

The embodiments of the present invention relate to a semiconductor device.

BACKGROUND

In recent years, a TFET (Tunnel Field-Effect Transistor) that employs a quantum-mechanical effect of electrons has been developed. In this TFET, by applying a voltage to a gate electrode, BTBT (Band To Band Tunneling) occurs between a source and a channel. As a result, the TFET becomes an on-state.

Generally, a TFET has a BTBT threshold voltage that depends on the impurity concentration of a diffusion layer and corresponds to the respective impurity concentrations. That is, a tunneling current that is generated from a part of a source diffusion layer having a low impurity concentration flows at a small gate voltage (a low threshold voltage). On the other hand, a tunneling current that is generated from a part of a source diffusion layer having a high impurity concentration flows at a gate voltage (a high threshold voltage) applied at a level higher than the small gate voltage. Because an actual source diffusion layer of a TFET has an impurity concentration gradient, when the voltage of a gate electrode is swept to an on-side, BTBT having various threshold voltages occurs in the TFET one after another. Accordingly, a current that is observed when the TFET performs switching has an envelope of a tunneling current that corresponds to the respective impurity concentrations. In such a TFET, sub-threshold characteristics (hereinafter, also "SS characteristics") on a low-voltage side are originated from a tunneling current when a threshold voltage is small, that is, a tunneling current that is generated from a part of a source diffusion layer having a low impurity concentration. In BTBT that occurs in the source diffusion layer having a low impurity concentration, an electron tunneling distance is very long. For this reason, the SS characteristics are very moderate. Therefore, according to a conventional TFET, because a tunneling current component in a low gate voltage area is dominant, it is very difficult to obtain steep (sharp) SS characteristics.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a semiconductor layer on which semiconductor elements are provided is assumed as "an upper direction". Therefore, the term "upper direction" or "lower direction" occasionally differs from an upper direction or a lower direction based on a gravitational acceleration direction.

A semiconductor device according to the present embodiment comprises a gate electrode. A semiconductor layer opposes to a bottom surface and a side surface of the gate electrode. An insulation film is provided between the bottom surface of the gate electrode and the semiconductor layer and between the side surface of the gate electrode and the semiconductor layer. A first conduction-type drain layer is provided in the semiconductor layer on a side of an end part of one of the bottom surface and the side surface of the gate electrode. A second conduction-type source layer is provided in the semiconductor layer opposing to the other one of the bottom surface and the side surface of the gate electrode. A second conduction-type extension layer is provided in the semiconductor layer opposing to a corner part between the side surface and the bottom surface of the gate electrode and has a lower impurity concentration than that of the source layer.

First Embodiment

Figure 1:
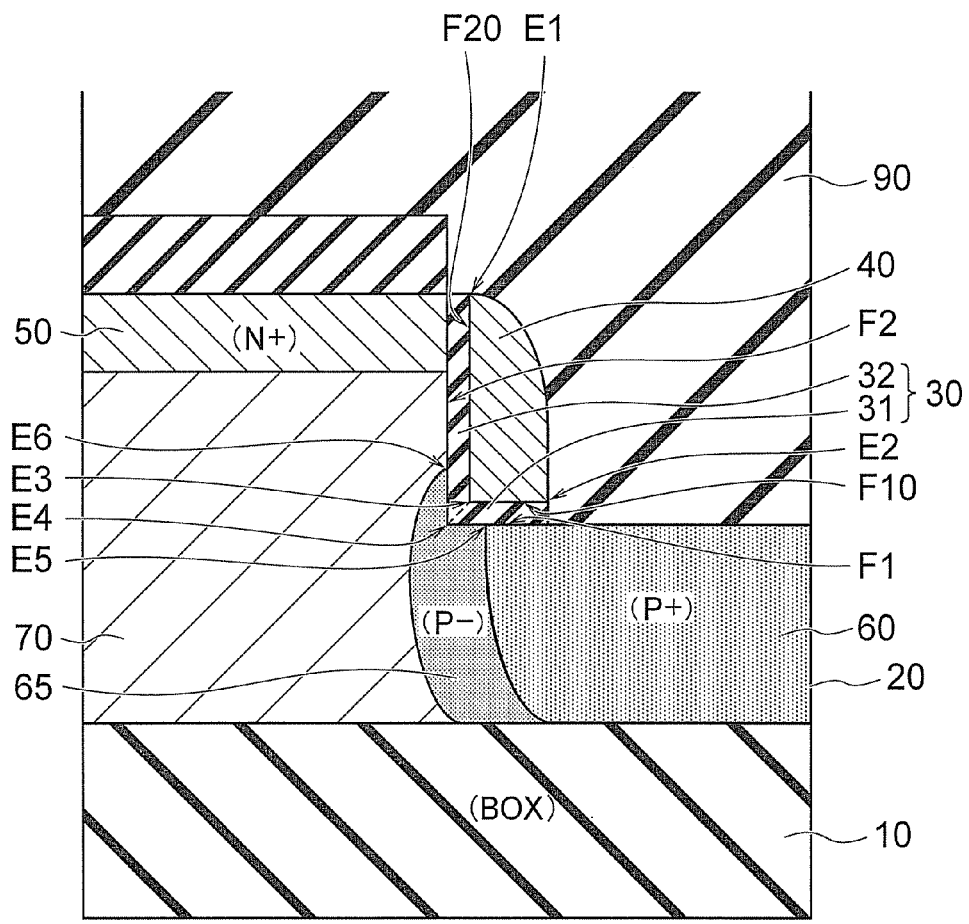
FIG. 1 is a cross-sectional view of an example of a configuration of an n-type TFET 100 according to a first embodiment.

FIG. 1 is a cross-sectional view of an example of a configuration of an n-type TFET 100 according to a first embodiment. The TFET 100 can be used for a microprocessor and a logic semiconductor integrated circuit such as an ASIC (Application Specific Integrated Circuit).

The TFET 100 includes a BOX (Buried Oxide) layer 10, a semiconductor layer 20, a gate dielectric film 30, a gate electrode 40, a drain layer 50, a source layer 60, an extension layer, 65, a low-concentration layer 70, and an interlayer dielectric film 90.

The semiconductor layer 20 is an SOI (Silicon On Insulator) layer provided on the BOX layer 10. The semiconductor layer 20 is formed so as to include a top surface F1 and a side surface F2 that crosses the top surface F1 in a substantially vertical direction.

The gate dielectric film 30 includes a first insulation film 31 that is provided on the top surface F1 of the semiconductor layer 20 and a second insulation film 32 that is provided on the side surface F2 of the semiconductor layer 20. The first insulation film 31 is connected to the second insulation film 32 so that they cross with each other at a corner part E3 between a side surface F20 of the gate electrode 40 and a bottom surface F10 of the gate electrode 40. Accordingly, the gate dielectric film 30 that is constituted by the first insulation film 31 and the second insulation film 32 has an L-shaped cross-section so as to bend along the corner part E3 of the gate electrode 40. When the corner part E3 of the gate electrode 40 is a substantially right angle, the gate dielectric film 30 also bends at a substantially right angle along the corner part E3 of the gate electrode 40. The gate dielectric film 30 is made of, for example, a silicon oxide film or a high dielectric material having a higher dielectric constant than that of the silicon oxide film.

The gate electrode 40 is provided on the top surface F1 and the side surface F2 of the semiconductor layer 20 via the gate dielectric film 30. The gate electrode 40 is formed so as to include the bottom surface F10 and the side surface F20 that crosses the bottom surface F10 in a substantially vertical direction. The bottom surface F10 of the gate electrode 40 opposes to (faces) the top surface F1 of the semiconductor layer 20 via the first insulation film 31. The side surface F20 of the gate electrode 40 opposes to (faces) the side surface F2 of the semiconductor layer 20 via the second insulation film 32. Therefore, the first insulation film 31 is provided between the top surface F1 of the semiconductor layer 20 and the bottom surface F10 of the gate electrode 40, and the second insulation film 32 is provided between the side surface F2 of the semiconductor layer 20 and the side surface F20 of the gate electrode 40. The gate electrode 40 is made of, for example, a conductive material such as n-type doped polysilicon.

The $n^+$-type drain layer 50 is provided on an upper part of the side surface F2 of the semiconductor layer 20. That is, the drain layer 50 is provided on the side surface F2 of the semiconductor layer 20 on a side of an upper end part E1 of the side surface F20 of the gate electrode 40. A side surface of the drain layer 50 opposes to an upper part of the side surface F20 of the gate electrode 40 via the second insulation film 32. The drain layer 50 is formed by introducing an n-type impurity (for example, arsenic or phosphorus) in the semiconductor layer 20.

The $p^+$-type source layer 60 is provided on the top surface F1 of the semiconductor layer 20 that opposes to the bottom surface F10 of the gate electrode 40. The source layer 60 is provided in the semiconductor layer 20 at an end part E2 of the gate electrode 40 on the side opposite to the corner part E3 between the side surface F20 of the gate electrode 40 and the bottom surface F10 of the gate electrode 40. That is, the source layer 60 opposes to the bottom surface F10 of the gate electrode 40 via the first insulation film 31 around the end part E2 of the gate electrode 40. The source layer 60 is formed by introducing a p-type impurity (for example, boron) in the semiconductor layer 20. As explained above, the drain layer 50 and the source layer 60 are provided at positions corresponding to opposing corners of the gate electrode 40 (E1 and E2), respectively.

The $p^-$-type extension layer 65 is provided on a surface of the semiconductor layer 20 that opposes to the corner part E3 of the gate electrode 40. More specifically, the extension layer 65 faces a part of the bottom surface F10 of the gate electrode 40 via the first insulation film 31, and also faces a part of the side surface F20 of the gate electrode 40 via the second insulation film 32. That is, the extension layer 65 faces both the bottom surface F10 and the side surface F20 of the gate electrode 40 at the corner part E3 and around the corner part E3. Furthermore, the impurity concentration of the extension layer 65 is lower than that of the source layer 60, and the extension layer 65 is provided between the source layer 60 and the low-concentration layer 70. The extension layer 65 is provided so as to extend from the source layer 60, and is formed by introducing a p-type impurity (for example, boron) in the semiconductor layer 20.

The low-concentration layer 70 is provided within the semiconductor layer 20 between the drain layer 50 and the extension layer 65. The low-concentration layer 70 separates the drain layer 50 from the extension layer 65. The low-concentration layer 70 is a semiconductor layer having a lower impurity concentration than those of the drain layer 50, the source layer 60, and the extension layer 65. For example, the low-concentration layer 70 can be a semiconductor layer (so-called "intrinsic semiconductor layer") having an impurity concentration of equal to or lower than $10^{16}/cm^3$.

The interlayer dielectric film 90 covers the gate electrode 40, the drain layer 50, the source layer 60, and the like. The interlayer dielectric film 90 is formed of, for example, an insulation film such as a TEOS film or a silicon oxide film. Although not shown, a wiring configuration that is constituted by contacts, metal wires, interlayer dielectric films, and the like is further provided within the interlayer dielectric film 90 or on the interlayer dielectric film 90.

The TFET 100 according to the first embodiment is on-off controlled by employing an electron tunneling effect, while voltages applied to the gate electrode 40, the source layer 60, and the drain layer 50 are substantially equal to those of a conventional MISFET. In this manner, sharp SS characteristics can be obtained. Operations of the TFET 100 according to the first embodiment are explained below in more detail.

In the n-type TFET 100 according to the first embodiment, a voltage of the same sign is applied to the gate electrode 40 and the drain layer 50. For example, it is assumed that a voltage of 0 V is applied to the source layer 60 and a positive voltage (for example, 1 V) is applied to the drain layer 50. That is, it is assumed that a reverse bias is applied to a junction part between the extension layer 65 and the low-concentration layer 70 and/or a junction part between the low-concentration layer 70 and the drain layer 50. To cause the TFET 100 to become an on-state, a positive voltage is applied to the gate electrode 40.

In a case where a source voltage (for example, 0 V) is used as a reference, when a gate voltage is less than a threshold voltage of the TFET 100, the TFET 100 is in an off-state. At this time, tunneling of electrons from the source layer 60 is prohibited. That is, because a very small current (an off-leakage current) caused by a reverse bias flows between the source layer 60 and the drain layer 50, it is possible to consider the TFET 100 as being in an off-state.

When a positive voltage with respect to the source voltage is applied to the gate electrode 40, depletion of a channel part starts. When the gate voltage is equal to or larger than the threshold voltage with respect to the source voltage, electronic interband transition (hereinafter, also BTBT) occurs at a channel part between the source layer 60 and the drain layer 50. The voltage of the gate electrode 40 when BTBT occurs is called the threshold voltage of the TFET 100. The threshold voltage is a gate voltage that indicates that the TFET 100 is in an on-state.

When a voltage is applied to the gate electrode 40 to cause the TFET 100 to become an on-state, an energy band is modulated in the extension layer 65. Because the impurity concentration of the extension layer 65 is lower than that of the source layer 60, a depletion layer that extends in the extension layer 65 near the gate electrode 40 is larger than a depletion layer that extends in the source layer 60 near the gate electrode 40. Generally, a depletion layer is not a start point of BTBT. That is, electrons hardly tunnel from the depleted extension layer 65 into a channel region. In the TFET 100 according to the first embodiment, an electric field from the gate electrode 40 is applied to the extension layer 65 without via the source layer 60 having a high impurity concentration. Accordingly, a depletion layer extends to a deep part (a bottom part) of the extension layer 65. Therefore, BTBT does not occur by the extension layer 65 being a start point.

Also in a conventional planer-type TFET, BTBT hardly occurs between a surface region of the depleted extension layer 65 and a channel region. However, in the planer-type TFET, an extension layer extends even under a bottom part of a source layer. For this reason, an electric field from a gate electrode terminates in the source layer having a high impurity concentration and cannot reach the extension layer under the source layer. Therefore, even when a voltage is applied to the gate electrode, the extension layer under the source layer is not depleted. As a result, BTBT may occur by the extension layer being a start point. That is, in the conventional planer-type TFET, BTBT may occur from the extension layer to an intrinsic semiconductor layer. When such BTBT having a relatively long tunneling distance from the extension layer to a surface of the intrinsic semiconductor layer occurs, it is difficult to obtain sharp SS characteristics. A line connecting a start point where BTBT of electrons occurs to an end point is called a tunneling path, and the distance of the tunneling path is called a tunneling distance.

According to the first embodiment, the entire top surface of the extension layer 65 faces the bottom surface F10 and the side surface F20 of the gate electrode 40 via the gate dielectric film 30. Therefore, when a voltage is applied to the gate electrode 40, a linear tunneling path from the source layer 60 to the low-concentration layer 70 is blocked by the gate dielectric film 30. That is, it is inevitable that the tunneling path from the source layer 60 to the low-concentration layer 70 is formed in an L-shape via an end part E5. Because of such a tunneling path, the tunneling distance from the source layer 60 to the low-concentration layer 70 is much longer than that of a conventional planer-type TFET, and substantially, BTBT does not occur.

Because the extension layer 65 is depleted when the TFET 100 becomes an on-state, the extension layer 65 does not become a start point of BTBT.

In this manner, BTBT that moderates SS characteristics from the source layer 60 to the low-concentration layer 70 and from the extension layer 65 to low-concentration layer 70 can be suppressed. As a result, the TFET 100 becomes an on-state due to BTBT having a short tunneling distance from the source layer 60 to the extension layer 65.

As explained above, according to the TFET 100 of the first embodiment, BTBT from the extension layer 65 and the source diffusion layer 60 to the low-concentration layer 70 is suppressed, and BTBT having a relatively short tunneling distance is permitted. Therefore, sharp SS characteristics can be obtained.

By improving SS characteristics, an off-current is reduced. As a result, a power supply voltage can be reduced, and thus a circuit using the TFET 100 according to the first embodiment becomes a circuit with low consumption power.

FIGS. 2A to 6B are cross-sectional views of a manufacturing method of the TFET 100 according to the first embodiment.

Figure 2A:
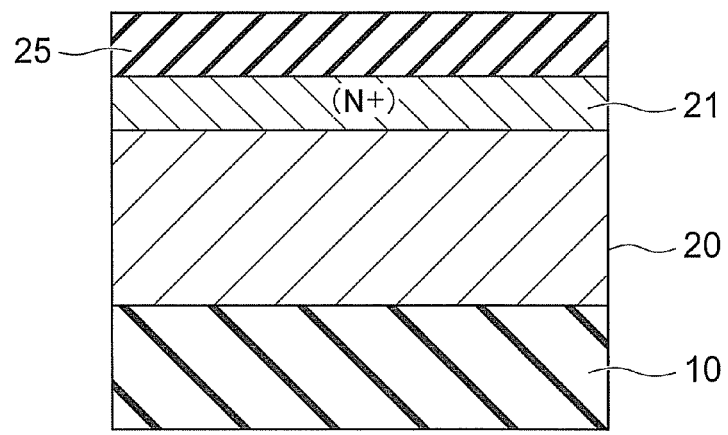
FIGS. 2A to 6B are cross-sectional views of a manufacturing method of the TFET 100 according to the first embodiment.

As shown in FIG. 2A, a semiconductor layer 21 that contains an n-type impurity (for example, phosphorus or arsenic) is epitaxially grown on the semiconductor layer 20. The semiconductor layer 20 can be an SOI layer of an SOI substrate, can be a silicon layer formed of a bulk silicon substrate, or can be a semiconductor layer formed of a III-V compound semiconductor substrate. The semiconductor layer 20 can be a semiconductor layer that is epitaxially grown on an arbitrary substrate. The semiconductor layer 20 can be a SiGe layer that is epitaxially grown on an SOI substrate or a bulk substrate. The semiconductor layer 21 can be epitaxially grown silicon, and after the subsequent process step, the semiconductor layer 21 becomes the drain layer 50.

Next, a hard mask 25 is deposited on the semiconductor layer 21 by a CVD (Chemical Vapor Deposition) method and the like. The hard mask 25 is, for example, an insulation film such as a silicon nitride film deposited on the semiconductor layer 20.

Figure 2B:
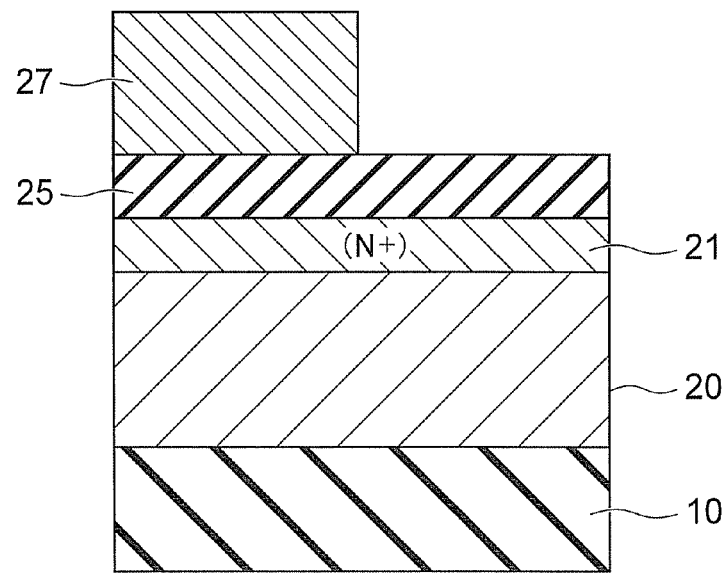
Figure 3A:
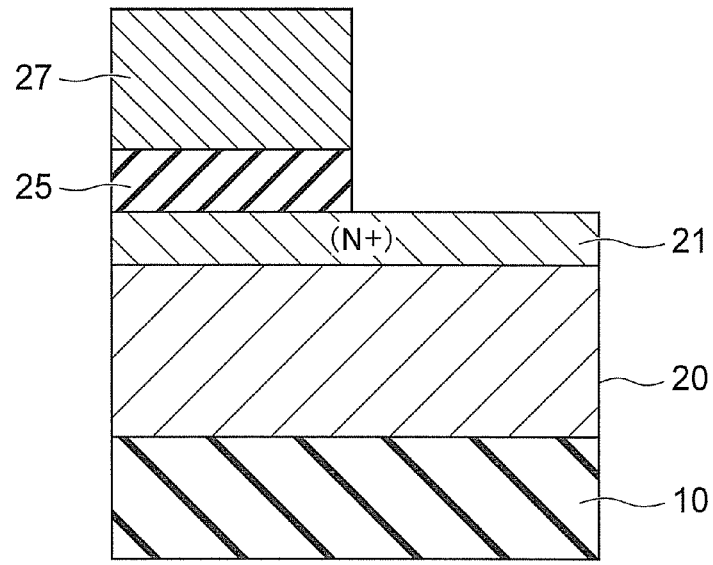
Figure 3B:
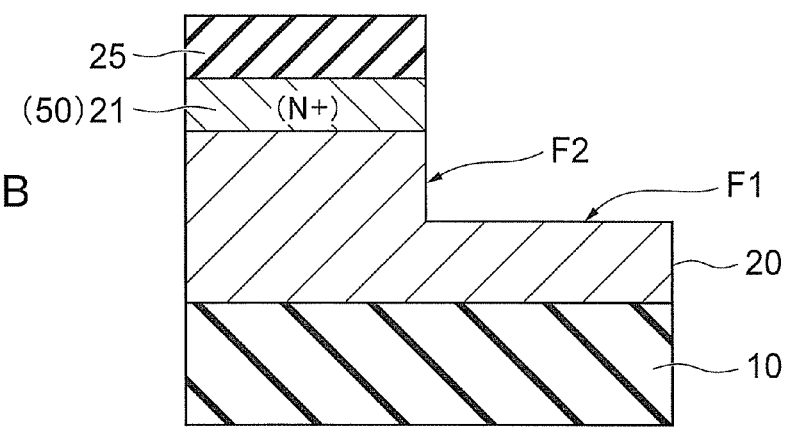

Next, as shown in FIG. 2B, an area where the drain layer 50 is formed is covered by a photoresist 27 using a lithography technique. As shown in FIG. 3A, while the photoresist 27 is used as a mask, the hard mask 25 is then etched by an RIE (Reactive Ion Etching) method.

After the photoresist 27 is removed, while the hard mask 25 is used as a mask, the silicon layer 21 and an upper part of the semiconductor layer 20 are etched by the RIE method. As a result, a configuration shown in FIG. 3B can be obtained. At this etching step, the semiconductor layer 21 remains in the area where the drain layer 50 is formed. Accordingly, the semiconductor layer 21 is also called the drain layer 50 below. In an area other than the area where the drain layer 50 is formed, the silicon layer 21 is removed. In the area other than the area where the drain layer 50 is formed, the upper part of the semiconductor layer 20 is also removed. Therefore, the side surface F2 of the semiconductor layer 20 and the drain layer 50 is exposed. The top surface F1 of the semiconductor layer 20 is also exposed.

Next, the material of a sidewall film 29 is deposited on the side surface F2 and top surface F1 of the semiconductor layer 20 by the CVD method. For example, the material of the sidewall film 29 is an insulation film such as a silicon nitride film. Next, by anisotropically etching the material of the sidewall film 29 by the RIE method and the like, the sidewall film 29 remains on the side surface F2 of the semiconductor layer 20, the drain layer 50, and the hard mask 25.

Figure 4A:
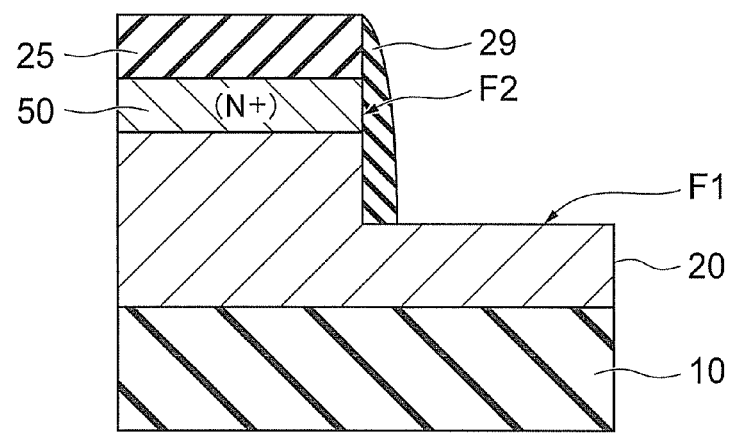

In this manner, a configuration shown in FIG. 4A can be obtained.

Figure 4B:
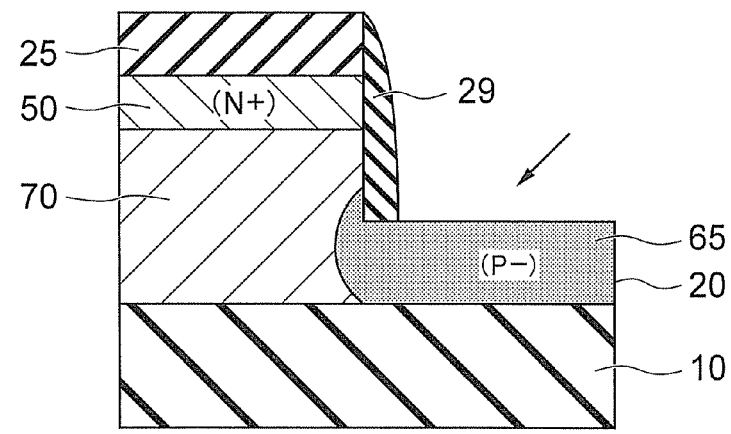

Next, while the hard mask 25 and the sidewall film 29 are used as a mask, as shown in FIG. 4B, a p-type impurity (for example, B or $BF_2$) is implanted in an area where the source layer 60 is formed. For example, an impurity is implanted first in a direction that is inclined with respect to the top surface F1. This implantation is performed so that the impurity rounds a side of the channel side surface F2. The impurity is then implanted from a direction vertical to the top surface F1. The concentration of the second implantation is higher than that of the first implantation.

Figure 5A:
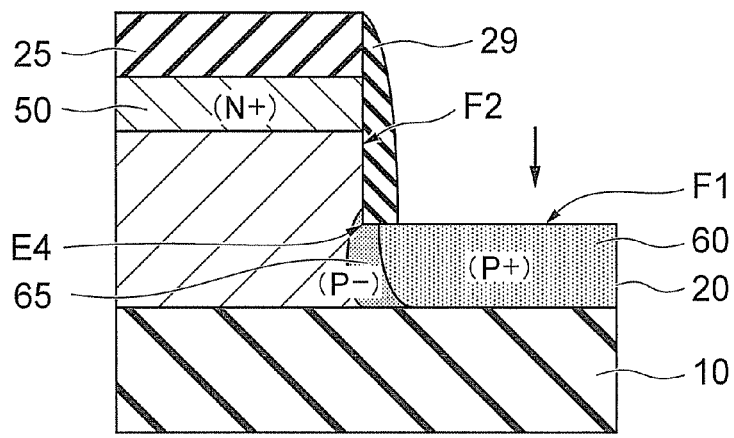

Next, activation annealing such as RTA (Rapid Thermal Annealing) is performed. As a result, as shown in FIG. 5A, the source layer 60 is formed. Furthermore, the p-type impurity is diffused, so that the p⁻-type extension layer 65 is formed. The source layer 60 is formed on the top surface F1 of the semiconductor layer 20. By annealing, the impurity of the source layer 60 diffuses from the top surface F1 of the semiconductor layer 20 to the side surface F2. In this manner, the extension layer 65 is formed so as to cover a corner part E4 from the top surface F1 of the semiconductor layer 20 to the side surface F2. The semiconductor layer 20 between the extension layer 65 and the drain layer 50 becomes the low-concentration layer 70.

Figure 5B:
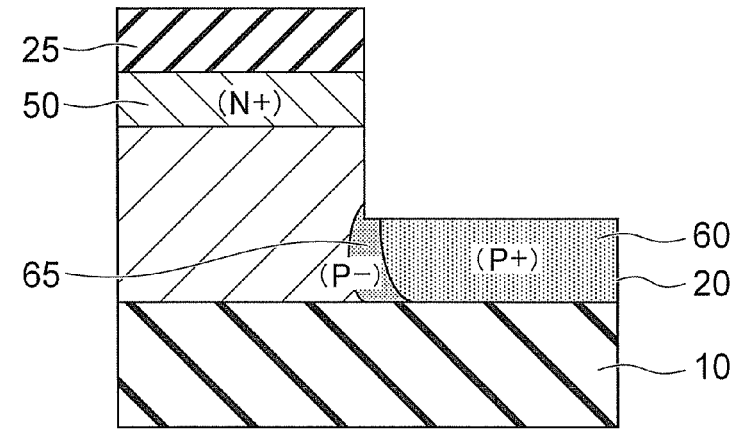

Next, as shown in FIG. 5B, the sidewall film 29 is removed by wet etching.

Figure 6A:
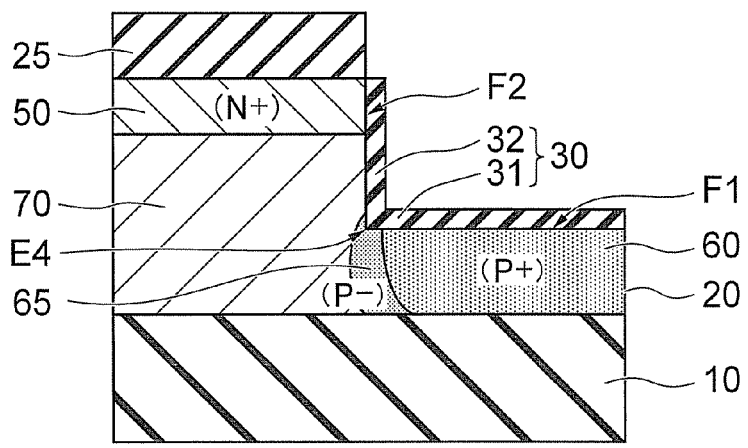

Next, as shown in FIG. 6A, the surface and/or the side surface of the semiconductor layer 20 and the drain layer 50 are oxidized, thereby forming the gate dielectric film 30. The gate dielectric film 30 includes the first insulation film 31 formed on the top surface F1 of the semiconductor layer 20 and the second insulation film 32 formed on the side surface F2 of the semiconductor layer 20 and the drain layer 50. The first and second insulation films 31 and 32 are connected together so as to be substantially orthogonal to each other at the corner part E4.

Figure 6B:
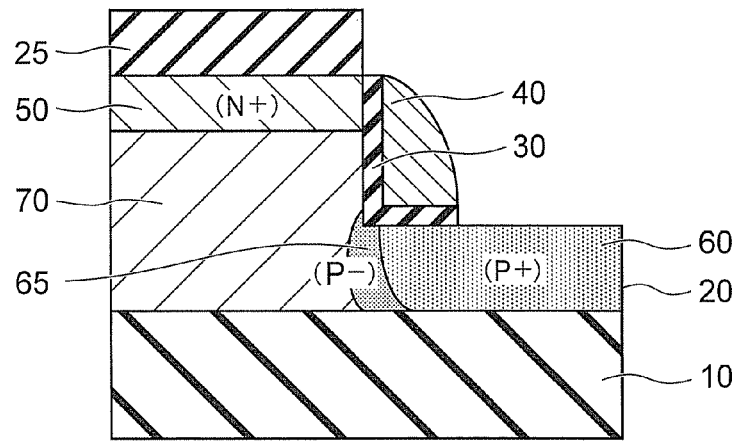

Next, the material of the gate electrode 40 is deposited on the gate dielectric film 30 and the hard mask 25. The material of the gate electrode 40 is made of, for example, polysilicon that contains an n-type impurity (for example, phosphorus or arsenic). After the gate electrode 40 is activated by RTA and the like, the gate electrode 40 is processed by a lithography technique and the RIE method. In this manner, as shown in FIG. 6B, the gate electrode 40 is formed on the gate dielectric film 30.

Figure 7A:
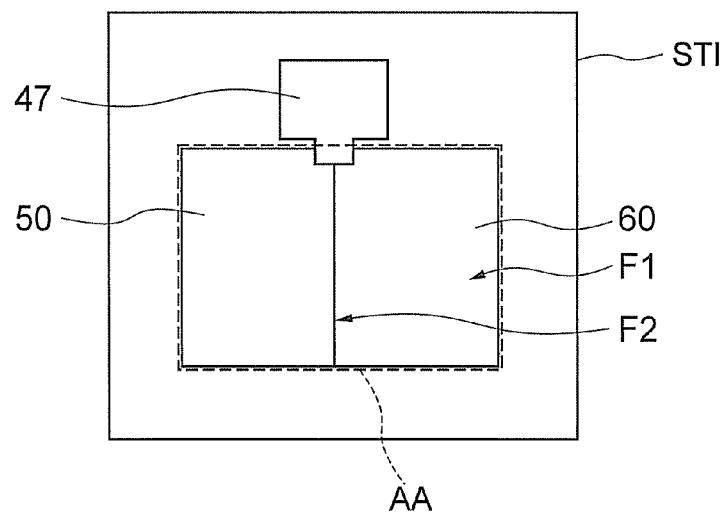
FIG. 7A is a plan view at a point when a photoresist 47 is formed on the material of the gate electrode 40.
Figure 7B:
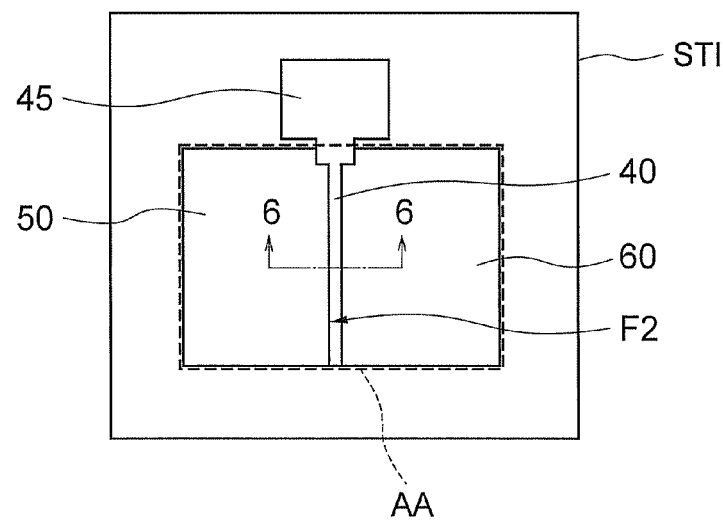
FIG. 7B is a plan view after the material of the gate electrode 40 is processed.

FIGS. 7A and 7B are plan views of the TFET 100 at a process step of processing the gate electrode 40. FIG. 7A is a plan view at a point when a photoresist 47 is formed on the material of the gate electrode 40. FIG. 7B is a plan view after the material of the gate electrode 40 is processed. In FIG. 7A, the material of the gate electrode 40 is omitted for convenience.

As shown in FIG. 7A, the drain layer 50 and the source layer 60 are formed within an active area AA that is surrounded by a shallow trench isolation region STI. The material of the gate electrode 40 is deposited on the drain layer 50, the source layer 60, and the shallow-trench isolation region STI. Furthermore, the photoresist 47 is formed on the material of the gate electrode 40. The photoresist 47 is formed in an area where a gate pad is formed. While the photoresist 47 is used as a mask, the material of the gate electrode 40 is anisotropically etched by the RIE method. At this time, as shown in FIG. 6A and the like, there is a step between the drain layer 50 and the source layer 60. Therefore, the material of the gate electrode 40 remains in a self-alignment manner on the gate dielectric film 30 similarly to a sidewall along the side surface F2 of the semiconductor layer 20. That is, as shown in FIG. 7B, the gate electrode 40 is formed so as to extend along the side surface F2 in a boundary part between the drain 50 and the source layer 60 to be connected to a gate pad 45. After the gate electrode 40 is processed, the photoresist 47 is removed, so that a configuration shown in FIG. 7B can be obtained. FIG. 6B is a cross-sectional view along a line 6-6 of FIG. 7B.

A combination of the gate electrode 40 and the gate dielectric film 30 can be a combination of polysilicon and SiON or can be a combination of a metal gate and a high dielectric film. When a combination of the gate electrode 40 and the gate dielectric film 30 is the combination of a metal gate and a high dielectric material, the material of the metal gate can be TiN, TaN, TaxOy (for example, $Ta_2O_5$), and the like, and the material of the high dielectric film can be HfOx, HfON, HfSiOx, HfSiON, $Al_2O_3$, HfAlOx and the like. x and y are positive numbers. Alternatively, the gate electrode 40 may be a multilayer structure of polysilicon and a metal material including TiN, TaN, $Ta_xO_y$ and the like, and the gate dielectric film 30 may be a multilayer structure of $SiO_2$, SiN or SiON and a high dielectric material described above. Furthermore, the gate electrode 40 can have a stacked configuration of, for example, TEOS, polysilicon, and SiON.

Thereafter, the TFET 100 shown in FIG. 1 is completed as the interlayer dielectric film 90, contacts (not shown), metal wires (not shown), and the like are provided.

According to the first embodiment, the entire top surface of the extension layer 65 faces the bottom surface F10 or the side surface F20 of the gate electrode 40 via the gate dielectric film 30. Therefore, not only a surface of the low-concentration layer 70 but also a surface of the extension layer 65 functions as a channel part. The gate dielectric film 30 is formed so as to have an L-shaped cross-section, and the gate electrode 40 opposes to the semiconductor layer 20 (the extension layer 65 and the low-concentration layer 70) via the gate dielectric film 30. Accordingly, the cross-section of the channel part is also formed in an L-shape. Accordingly, the gate dielectric film 30 is interposed between the source layer 60 and the low-concentration layer 70, and thus the possibility of occurrence of BTBT from the source layer 60 to the low-concentration layer 70 and that from the extension layer 65 to the low-concentration layer 70 is very low. The source layer 60 is not interposed between the extension layer 65 and the gate dielectric film 30. This is because when the source layer 60 is interposed between the extension layer 65 and the gate dielectric film 30, the extension layer 65 is hardly depleted and may become a start point of BTBT.

As a result, the TFET 100 according to the first embodiment becomes an on-state mainly due to BTBT between the source layer 60 and the extension layer 65. SS characteristics of the TFET 100 can thus be improved. By improving SS characteristics, the off-current and power consumption can be reduced.

While an n-type TFET has been explained in the first embodiment, by changing the conductivity type of an impurity, a p-type TFET can be also easily formed. When using a source voltage as a reference, the p-type TFET becomes an on-state when a gate voltage is lower than a threshold voltage and becomes an off-state when the gate voltage is higher than the threshold voltage. For example, a p-type TFET in a CMOS inverter and the like becomes an on-state when a positive voltage (for example, 1 V) is applied to a source and a gate voltage is 0 V, and becomes an off-state when the gate voltage is a power supply voltage (for example, 1 V). Effects of the first embodiment are not lost even when such a p-type TFET is used, and this holds true for the following embodiments.

Second Embodiment

Figure 8:
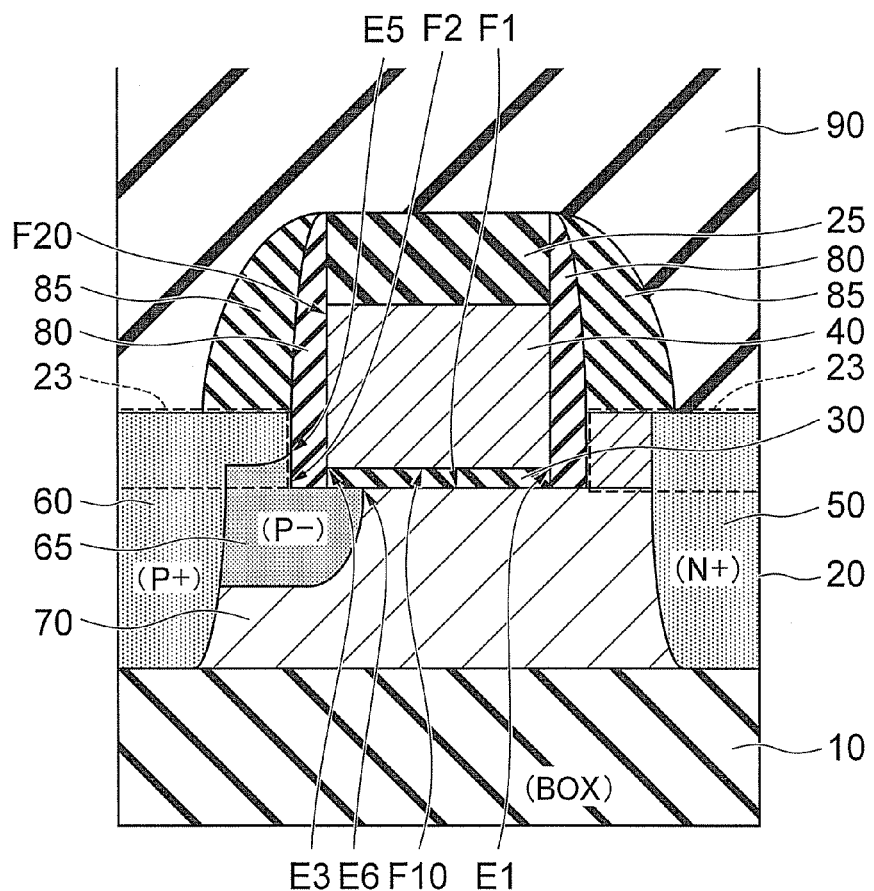
FIG. 8 is a cross-sectional view of an example of a configuration of an n-type TFET 200 according to a second embodiment.

FIG. 8 is a cross-sectional view of an example of a configuration of an n-type TFET 200 according to a second embodiment. The TFET 200 is a planer-type transistor. The drain layer 50 and the source layer 60 are provided to be opposite to each other with the gate electrode 40 being provided therebetween, and are formed to have substantially the same height.

The TFET 200 according to the second embodiment includes the BOX layer 10, the semiconductor layer 20, the gate dielectric film 30, the gate electrode 40, the drain layer 50, the source layer 60, the extension layer 65, the low-concentration layer 70, a sidewall insulation film 80, a spacer 85, and the interlayer dielectric film 90. The semiconductor layer 20 is not limited to an SOI layer provided on the BOX layer 10, and can be the same as the semiconductor layer 20 according to the first embodiment. A broken line area of FIG. 8 is an epitaxial layer 23 formed on an SOI layer as the semiconductor layer 20. The material of the epitaxial layer 23 can be different from that of the SOI layer. For example, the epitaxial layer 23 is made of silicon, germanium, or $Si_{1-X}Ge_X$. Because the epitaxial layer 23 is also made of a semiconductor material, the epitaxial layer 23 is explained below as a part of the semiconductor layer 20.

That is, the semiconductor layer 20 includes the SOI layer provided on the BOX layer 10 and the epitaxial layer 23. The semiconductor layer 20 is formed so as to include the top surface F1 and the side surface F2 that crosses the top surface F1. The side surface F2 is a side surface of the epitaxial layer 23.

The gate dielectric film 30 as a first insulation film is provided on the top surface F1 of the semiconductor layer 20. The material of the gate dielectric film 30 can be the same as that of the gate dielectric film 30 according to the first embodiment.

The gate electrode 40 is provided on the top surface F1 of the semiconductor layer 20 via the gate dielectric film 30. The gate electrode 40 is formed so as to include the bottom surface F10 and the side surface F20 that crosses the bottom surface F10 in a substantially vertical direction. The bottom surface F10 of the gate electrode 40 opposes to (faces) the top surface F1 of the semiconductor layer 20 via the gate dielectric film 30. The side surface F20 of the gate electrode 40 opposes to (faces) the side surface F2 of the semiconductor layer 20 via the sidewall insulation film 80 as a second insulation film. Therefore, the gate dielectric film 30 is provided between the top surface F1 of the semiconductor layer 20 and the bottom surface F10 of the gate electrode 40, and the sidewall insulation film 80 is provided between the side surface F2 of the semiconductor layer 20 and the side surface F20 of the gate electrode 40. The material of the gate electrode 40 can be the same as that of the gate electrode 40 according to the first embodiment. The sidewall insulation film 80 is explained later.

The $n^+$-type drain layer 50 is provided on the semiconductor layer 20 on a side of one end part E1 of the bottom surface F1 of the gate electrode 40. The drain layer 50 is not provided immediately below the gate electrode 40, and is separated from the gate electrode 40. That is, the drain layer 50 is provided to be offset from the gate electrode 40. Therefore, the entire bottom surface of the gate electrode 40 faces the extension layer 65 or the low-concentration layer 70, but does not face the drain layer 50.

The $p^+$-type source layer 60 is provided on the side surface F2 of the semiconductor layer 20 that opposes to the side surface F20 of the gate electrode 40. The source layer 60 includes a part that is shallower than the top surface F1 of the semiconductor layer 20 or the bottom surface F10 of the gate electrode 40 and a part that is deeper than the top surface F1 and the bottom surface F10. The source layer 60 faces the side surface F20 of the gate electrode 40 in the shallow part and is separated from the side surface F20 of the gate electrode 40 in the deep part. The deep part of the source layer 60 is formed to reduce a parasitic capacity and junction leakage. However, the deep part of the source layer 60 can be omitted.

The $p^-$-type extension layer 65 is provided on a surface of the semiconductor layer 20 that opposes to the corner part E3 of the gate electrode 40. More specifically, the extension layer 65 faces a part of the bottom surface F10 of the gate electrode 40 via the gate dielectric film 30, and also faces a part of the side surface F20 of the gate electrode 40 via the sidewall insulation film 80. That is, the extension layer 65 opposes to both the bottom surface F10 and the side surface F20 of the gate electrode 40 at the corner part E3 and around the corner part E3. Furthermore, the impurity concentration of the extension layer 65 is lower than that of the source layer 60, and the extension layer 65 is provided between the source layer 60 and the low-concentration layer 70. The extension layer 65 is provided so as to extend from the source layer 60.

The low-concentration layer 70 is provided within the semiconductor layer 20 between the drain layer 50 and the extension layer 65. The low-concentration layer 70 separates the drain layer 50 from the extension layer 65. The low-concentration layer 70 is a semiconductor layer having a lower impurity concentration than those of the drain layer 50, the source layer 60, and the extension layer 65. For example, the low-concentration layer 70 can be an intrinsic semiconductor layer.

The sidewall insulation film 80 is an insulation film that covers the side surface F20 of the gate electrode 40, and is formed of, for example, an insulation film such as a silicon nitride film. The sidewall insulation film 80 is provided between the side surface F20 of the gate electrode 40 and the side surface F2 of the semiconductor layer 20 (the epitaxial layer 23). Therefore, the gate dielectric film 30 and the sidewall insulation film 80 are interposed between the source layer 60 and the low-concentration layer 70, similarly to the gate dielectric film 30 according to the first embodiment. Accordingly, the gate dielectric film 30 and the sidewall insulation film 80 function similarly to the gate dielectric film 30 according to the first embodiment. Because the sidewall insulation film 80 is thicker than the gate dielectric film 30, BTBT from the $p^+$-type source layer 60 to the low-concentration layer 70 is further suppressed.

The spacer 85 is provided on a side surface of the sidewall insulation film 80, and is formed of an insulation film such as TEOS. The spacer 85 functions as a mask when the drain layer 50 and the source layer 60 are formed.

The interlayer dielectric film 90 can be the same as that of the first embodiment. Although not shown, a wiring configuration that is constituted by contacts, metal wires, interlayer dielectric films, and the like is further provided within the interlayer dielectric film 90 or on the interlayer dielectric film 90.

Basic operations of the TFET 200 according to the second embodiment can be identical to those of the first embodiment. Operations of the TFET 200 according to the second embodiment are explained below in more detail.

According to the second embodiment, the entire top surface of the extension layer 65 faces the bottom surface F10 or the side surface F20 of the gate electrode 40 via the gate dielectric film 30 and the sidewall insulation film 80. Therefore, not only the low-concentration layer 70 but also the extension layer 65 functions as a part of a channel part. Similarly to the first embodiment, BTBT from the extension layer 65 to the low-concentration layer 70 is prohibited.

Furthermore, the gate dielectric film 30 and the sidewall insulation film 80 are interposed between the side-surface end part E5 of the source layer 60 (a boundary part between the source layer 60 and the extension layer 65 on the side surface F2) and a surface end part E6 of the low-concentration layer 70 (a boundary part between the low-concentration layer 70 and the extension layer 65 on the top surface F1). Accordingly, similarly to the first embodiment, BTBT from the source layer 60 to the low-concentration layer 70 is suppressed.

Accordingly, the TFET 200 according to the second embodiment becomes an on-state mainly due to BTBT between the source layer 60 and the extension layer 65. Accordingly, the second embodiment can achieve effects identical to those of the first embodiment.

Further, according to the second embodiment, the drain layer 50 is not provided immediately below the gate electrode 40, and is offset from the channel part. Therefore, according to the second embodiment, off-leakage can be further reduced.

FIGS. 9A to 13B are cross-sectional views of a manufacturing method of the TFET 200 according to the second embodiment.

Figure 9A:
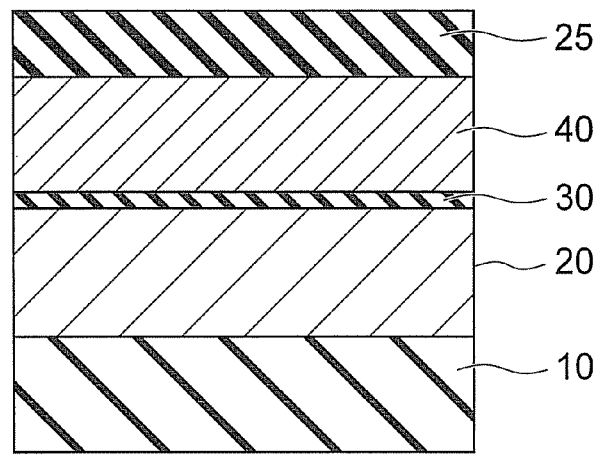
FIGS. 9A to 13B are cross-sectional views of a manufacturing method of the TFET 200 according to the second embodiment.

First, as shown in FIG. 9A, the gate dielectric film 30 and materials of the gate electrode 40 and the hard mask 25 are formed on the semiconductor layer 20. The gate dielectric film 30 can be a thermally oxidized film that is obtained by thermally oxidizing the semiconductor layer 20 or can be a TEOS film, a silicon nitride film (such as $Si_3N_4$), SiON, a high dielectric film (for example, $HfO_2$) formed by the CVD method, or the like.

The material of the gate electrode 40 is, for example, polysilicon having an n-type impurity doped therein. The n-type impurity can be implanted in polysilicon by implantation or can be doped when polysilicon is deposited by the CVD method (for example, in-situ dope CVD). As explained above, similarly to the first embodiment, a combination of the gate electrode 40 and the gate dielectric film 30 can be a combination of polysilicon and SiON or can be a combination of a metal gate and a high dielectric film.

Figure 9B:
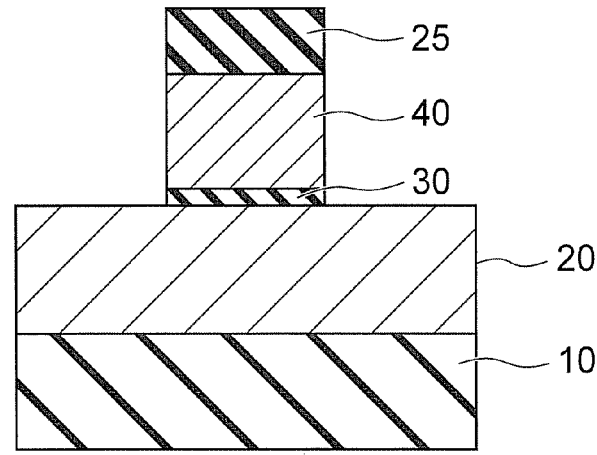

Next, the hard mask 25 is processed in a layout pattern of the gate electrode 40 by a lithography technique and the RIE method. Subsequently, while the hard mask 25 is used as a mask, the material of the gate electrode 40 and the gate dielectric film 30 are etched by the RIE method. As a result, as shown in FIG. 9B, the gate electrode 40 is formed.

Figure 10A:
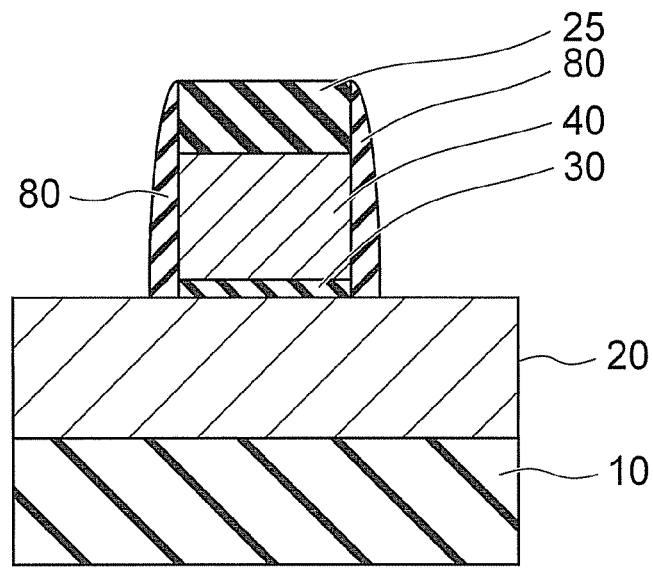
Figure 10B:
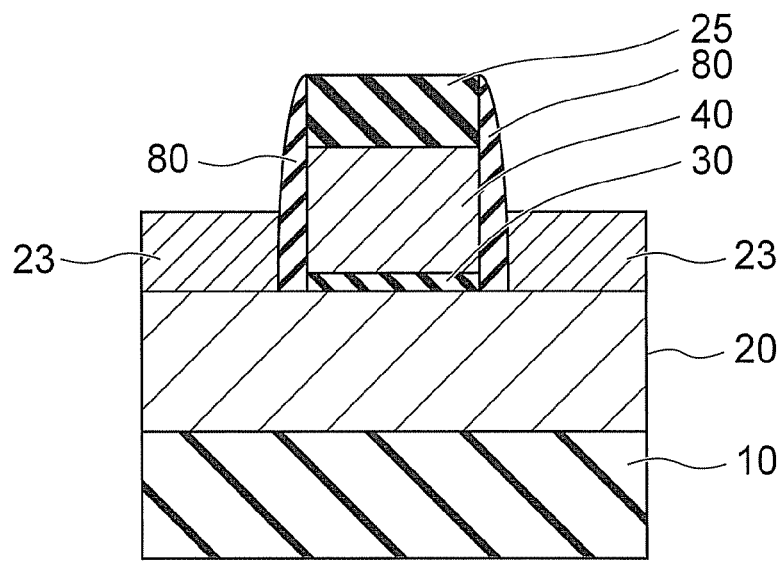

Next, after the material of the sidewall insulation film 80 (for example, a silicon nitride film) is deposited, the material of the sidewall insulation film 80 is anisotropically etched back by the RIE method. In this manner, as shown in FIG. 10A, the sidewall insulation film 80 is formed on a side surface of the gate electrode 40.

Next, the epitaxial layer 23 is grown on an exposed surface of the semiconductor layer 20. For example, the epitaxial layer 23 is preferably made of a material having a narrower band gap than that of silicon such as $Si_{1-x}Ge_X$. By using such a material for the source layer 60, tunneling efficiency increases, sharper SS characteristics can be obtained, and a larger on-current can be also obtained.

Figure 11A:
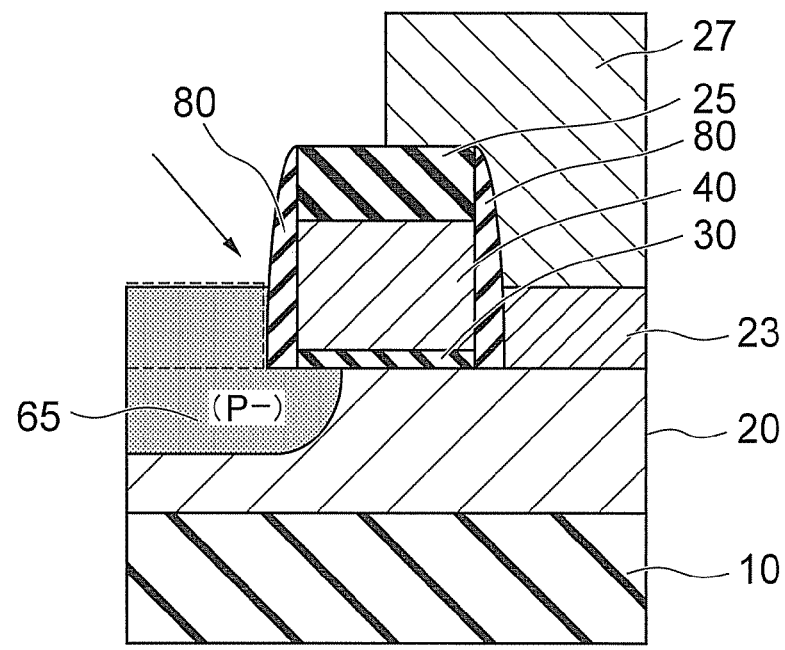

Next, as shown in FIG. 11A, an area where a drain layer is formed is covered by the photoresist 27 using a lithography technique. Subsequently, while the photoresist 27 is used as a mask, a p-type impurity (for example, B or $BF_2$) is implanted in an area where the source layer 60 or the extension layer 65 is formed. At this time, the impurity is implanted from a direction that is inclined to the surface of the semiconductor layer 20 (the epitaxial layer 23) downward toward the gate electrode 40. To form the extension layer 65, the impurity is implanted at a relatively low concentration.

Figure 11B:
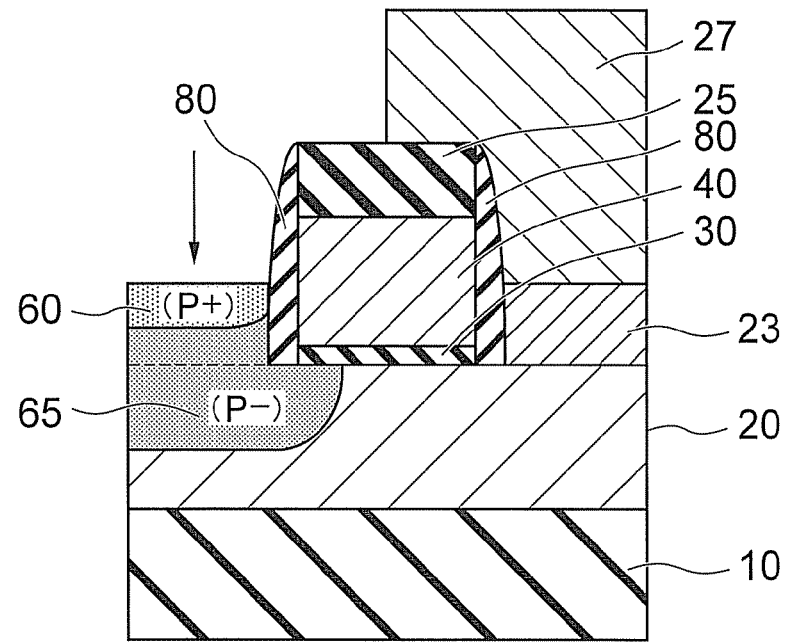

Next, a p-type impurity is implanted in an area where the source layer 60 is formed. At this time, as shown in FIG. 11B, the impurity is implanted from a direction that is substantially vertical to the surface of the semiconductor layer 20 (the epitaxial layer 23). The impurity is implanted at a relatively high concentration to form a shallow part of the source layer 60. Furthermore, the impurity is implanted at a low acceleration voltage so that the source layer 60 is shallower than the epitaxial layer 23 (the bottom surface F10 of the gate electrode 40).

Figure 12A:
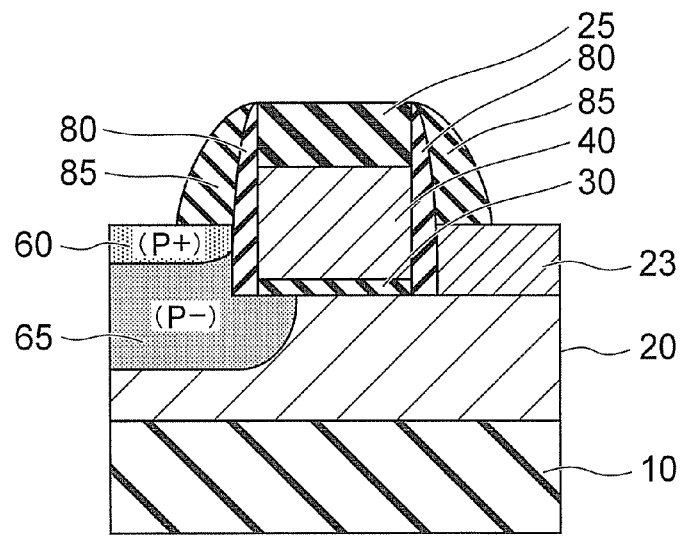

After the photoresist 27 is removed, the material of the spacer 85 (for example, TEOS) is deposited. By etching back the material of the spacer 85 by the RIE method, as shown in FIG. 12A, the spacer 85 remains on a side surface of the sidewall insulation film 80.

Figure 12B:
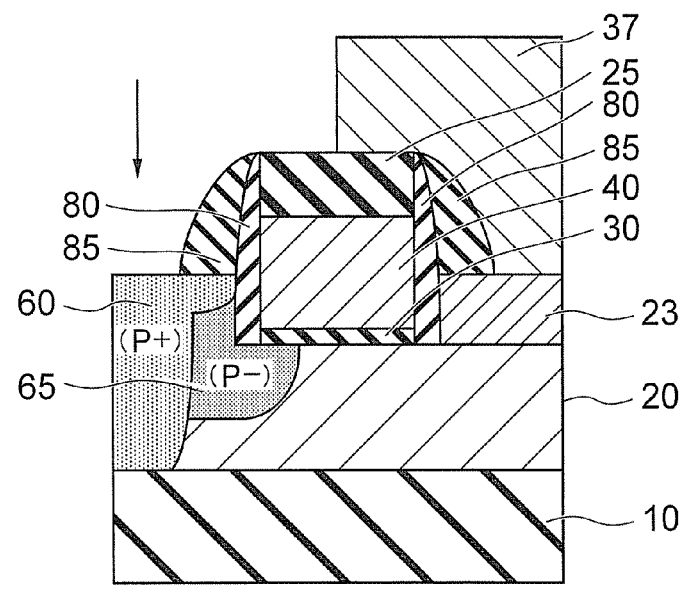

Next, as shown in FIG. 12B, the area where a drain layer is formed is covered by a photoresist 37 using a lithography technique. While the photoresist 37 and the spacer 85 are used as a mask, a p-type impurity (for example, B or $BF_2$) is implanted in the area where the source layer 60 is formed. At this time, as shown in FIG. 12B, the impurity is implanted from a direction that is substantially vertical to the surface of the semiconductor layer 20 (the epitaxial layer 23). The impurity is implanted at a relatively high concentration and at a high acceleration voltage to form a deep part of the source layer 60. The source layer 60 is not necessarily implanted at a high acceleration voltage. It suffices that the source layer 60 is formed so as to have a higher impurity concentration than that of the extension layer 65.

Figure 13A:
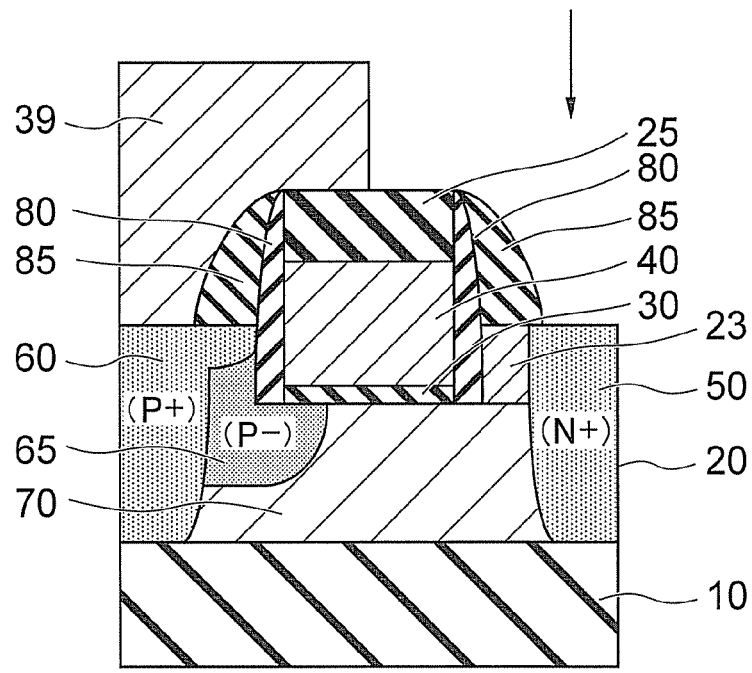

After the photoresist 37 is removed, as shown in FIG. 13A, the source layer 60 is covered by a photoresist 39 using a lithography technique. Next, while the photoresist 39 and the spacer 85 are used as a mask, an n-type impurity (for example, arsenic or phosphorus) is implanted in the area where a drain layer is formed. At this time, as shown in FIG. 13A, the impurity is implanted from a direction that is substantially vertical to the surface of the semiconductor layer 20 (the epitaxial layer 23). The impurity is implanted at a relatively high concentration and at a high acceleration voltage to form the deep drain layer 50. Because the spacer 85 is used as a mask, the drain layer 50 is not formed below the gate electrode 40, and is formed to be separated from the gate electrode 40. That is, the low-concentration layer 70 is interposed between the gate electrode 40 and the drain layer 50.

Figure 13B:
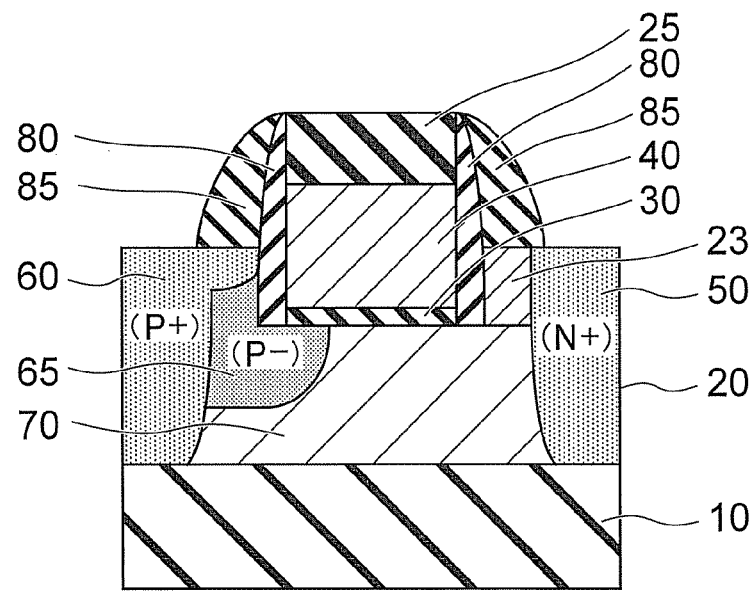

After the photoresist 39 is removed, activation annealing such as RTA is performed. As a result, the drain layer 50, the source layer 60, and the extension layer 65 are activated as shown in FIG. 13B.

Thereafter, the TFET 200 shown in FIG. 8 is completed as the interlayer dielectric film 90, contacts (not shown), metal wires (not shown), and the like are provided.

According to the second embodiment, the epitaxial layer 23 is made of $Si_{1-x}Ge_X$ having a narrower band gap than that of silicon in an SOI layer and the like. Therefore, tunneling efficiency from the source layer 60 to the extension layer 65 is improved, and sharper SS characteristics and a larger on-current can be obtained. Furthermore, as described above, the second embodiment can also achieve effects identical to those of the first embodiment.

Third Embodiment

Figure 14:
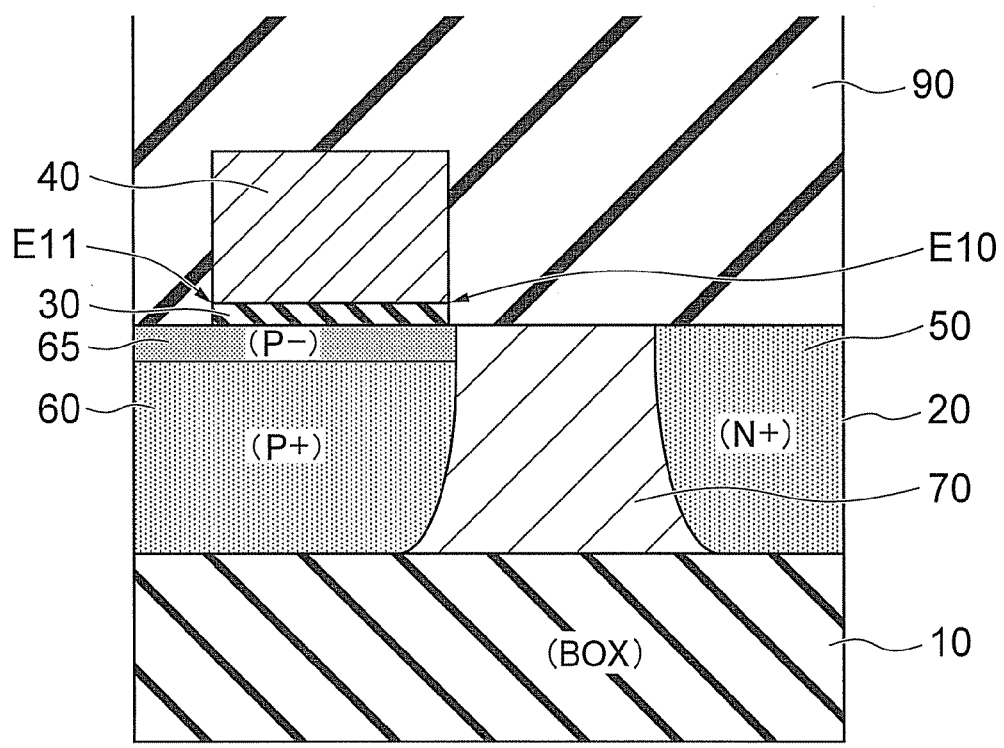
FIG. 14 is a cross-sectional view of an example of a configuration of an n-type TFET 300 according to a third embodiment.

FIG. 14 is a cross-sectional view of an example of a configuration of an n-type TFET 300 according to a third embodiment. The TFET 300 according to the third embodiment includes the BOX layer 10, the semiconductor layer 20, the gate dielectric film 30, the gate electrode 40, the drain layer 50, the source layer 60, the extension layer 65, the low-concentration layer 70, and the interlayer dielectric film 90.

The semiconductor layer 20 is not limited to an SOI layer provided on the BOX layer 10, and can be the same as the semiconductor layer 20 according to the first embodiment.

The gate dielectric film 30 is provided on the semiconductor layer 20. The material of the gate dielectric film 30 can be the same as that of the gate dielectric film 30 according to the first embodiment.

The gate electrode 40 is provided via the gate dielectric film 30 on the semiconductor layer 20. The gate electrode 40 is formed on the source layer 60 and the extension layer 65. That is, the entire bottom surface of the gate electrode 40 faces the source layer 60 or the extension layer 65 via the gate dielectric film 30. The material of the gate electrode 40 can be the same as that of the gate electrode 40 according to the first embodiment.

The $n^+$-type drain layer 50 is provided within the semiconductor layer 20 on a side of one end part E10 of the gate electrode 40. The drain layer 50 is not provided immediately below the gate electrode 40, and is separated from the gate electrode 40. That is, the drain layer 50 is provided to be offset from the gate electrode 40. Therefore, the bottom surface of the gate electrode 40 does not face the drain layer 50.

The $p^+$-type source layer 60 is provided within the semiconductor layer 20 on a side of the other end part E11 of the gate electrode 40, or within the semiconductor layer 20 below the gate electrode 40. The source layer 60 is formed so as to face the entire bottom surface of the gate electrode 40.

The $p^-$-type extension layer 65 is provided on the source layer 60 and faces the entire bottom surface of the gate electrode 40 via the gate dielectric film 30. That is, the extension layer 65 is provided between the gate dielectric film 30 and the source layer 60. The impurity concentration of the extension layer 65 is lower than that of the source layer 60. The extension layer 65 is formed by introducing a p-type impurity (for example, boron) in the semiconductor layer 20.

The low-concentration layer 70 is provided between the drain layer 50 and the extension layer 65 or the source layer 60 within the semiconductor layer 20. The low-concentration layer 70 separates the drain layer 50 from the extension layer 65 or the source layer 60.

The interlayer dielectric film 90 can be the same as that of the first embodiment. Although not shown, a wiring configuration that is constituted by contacts, metal wires, interlayer dielectric films, and the like is further provided within the interlayer dielectric film 90 or on the interlayer dielectric film 90.

In the TFET 300, the $p^-$-type extension layer 65 is provided on the $p^+$-type source layer 60, and the entire gate electrode 40 is provided on the extension layer 65. Accordingly, when the TFET 300 becomes an on-state, similarly to the first embodiment, BTBT occurs between the source layer 60 and the extension layer 65. In addition, because the gate electrode 40 is not provided on the low-concentration layer 70, BTBT from the extension layer 65 to the low-concentration layer 70 and from the source layer 60 to the low-concentration layer 70 is suppressed. Therefore, the TFET 300 according to the third embodiment becomes an on-state mainly due to BTBT between the source layer 60 and the extension layer 65. Accordingly, the third embodiment can achieve effects identical to those of the first embodiment.

Furthermore, according to the third embodiment, the drain layer 50 is not provided immediately below the gate electrode 40, and is offset from a channel part. Therefore, according to the third embodiment, off-leakage can be further reduced.

FIGS. 15A to 18B are cross-sectional views of a manufacturing method of the TFET 300 according to the third embodiment.

Figure 15A:
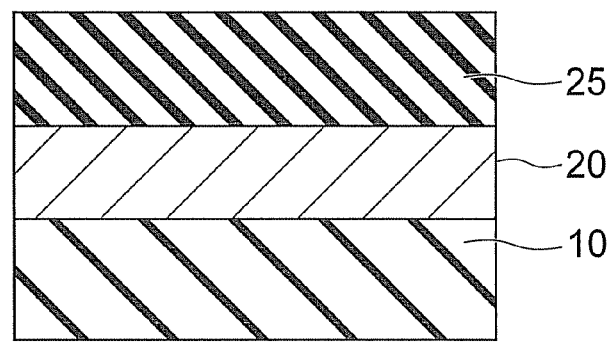
FIGS. 15A to 18B are cross-sectional views of a manufacturing method of the TFET 300 according to the third embodiment.

As shown in FIG. 15A, the material of the hard mask 25 is formed on the semiconductor layer 20. The material of the hard mask 25 is, for example, an insulation film such as TEOS.

Figure 15B:
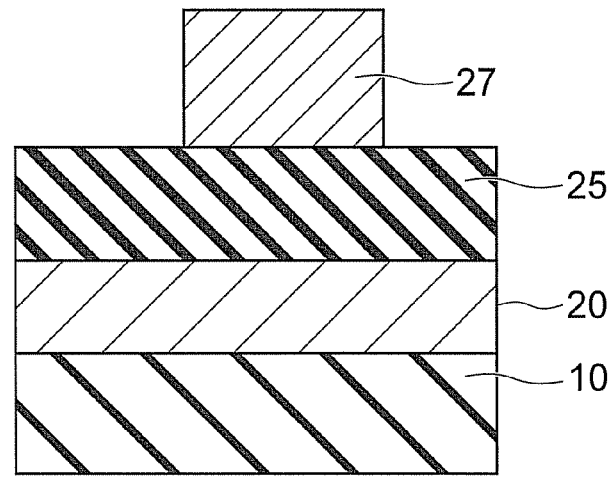

Next, as shown in FIG. 15B, on the material of the hard mask 25, the photoresist 27 is patterned in a pattern of covering an area other than areas where a source layer is formed and where a drain layer is formed by using a lithography technique.

Figure 16A:
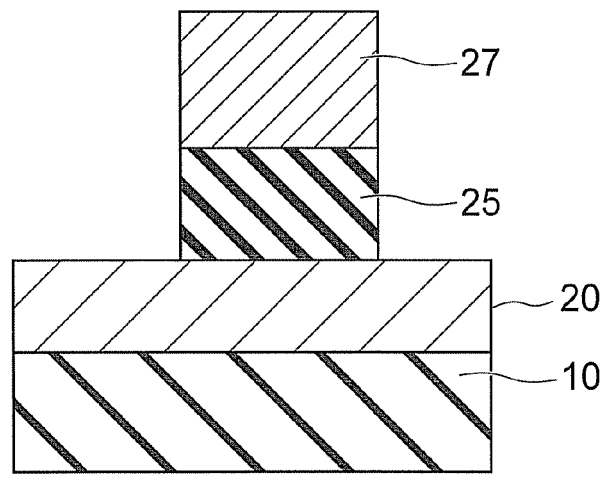

Next, as shown in FIG. 16A, while the photoresist 27 is used as a mask, the material of the hard mask 25 is etched by the RIE method.

Figure 16B:
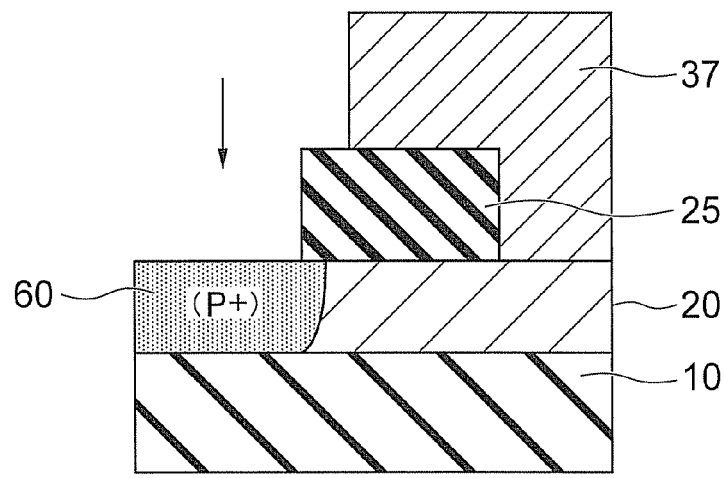

After the photoresist 27 is removed, as shown in FIG. 16B, the area where a drain layer is formed is covered by the photoresist 37 using a lithography technique. Next, while the photoresist 37 and the hard mask 25 are used as a mask, a p-type impurity (for example, B or $BF_2$) is implanted in the area where the source layer 60 is formed.

Figure 17A:
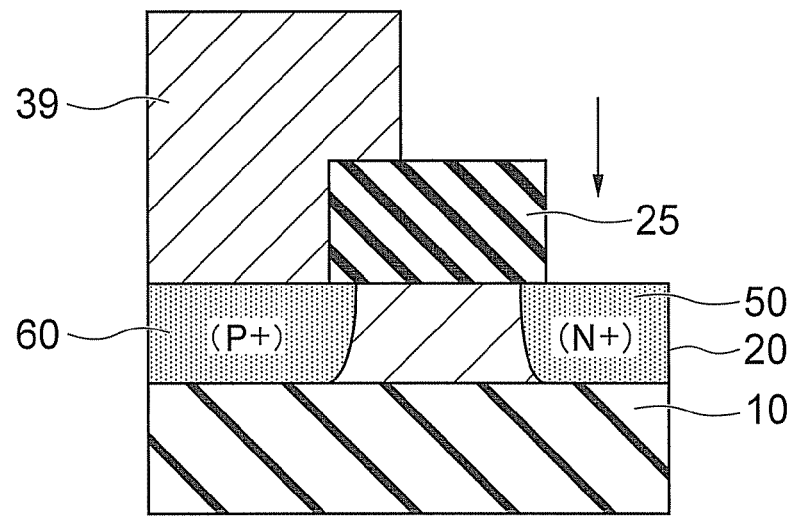
Figure 17B:
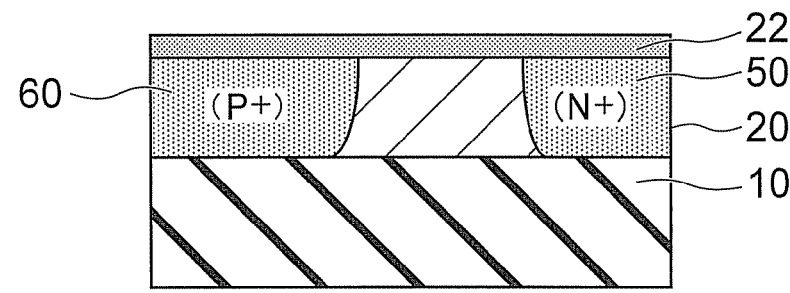

After the photoresist 37 is removed, as shown in FIG. 17A, the source layer 60 is covered by the photoresist 39 using a lithography technique. Next, while the photoresist 39 and the hard mask 25 are used as a mask, an n-type impurity (for example, phosphorus or arsenic) is implanted in the area where the drain layer 50 is formed.

After the photoresist 39 is removed, activation annealing such as RTA is performed. As a result, the drain layer 50 and the source layer 60 are activated. In this manner, the drain layer 50 and the source layer 60 are formed on both sides of the hard mask 25.

Next, after the hard mask 25 is removed by wet etching, the intrinsic semiconductor layer 22 is epitaxially grown on the semiconductor layer 20 by an epitaxial CVD method. The intrinsic semiconductor layer 22 is explained below as a part of the semiconductor layer 20. The epitaxially grown semiconductor layer 20 can be made of, for example, Ge and Si that contains Ge such as $Si_{1-x}Ge_x$, or can have an arbitrary stacked configuration of Si and Si that contains Ge.

Figure 18A:
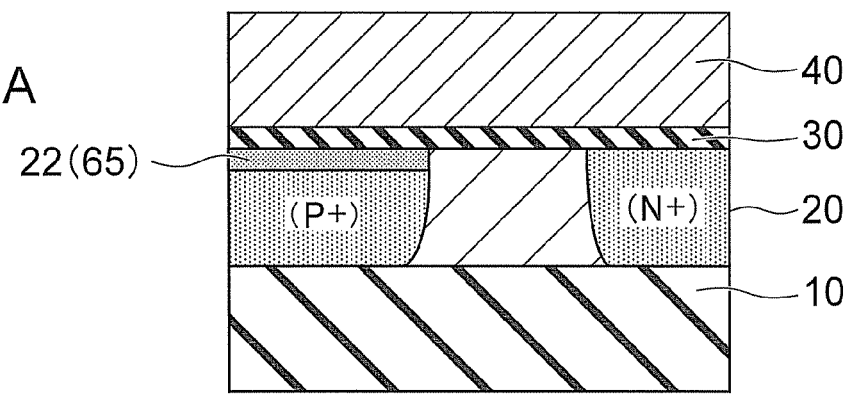
Figure 18B:
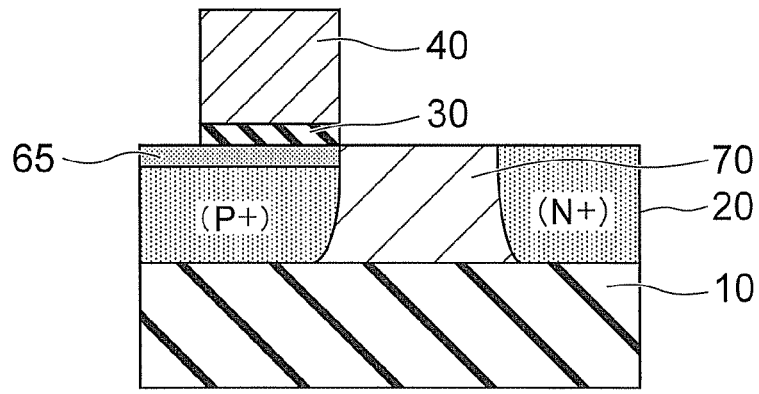

Next, as shown in FIG. 18A, by thermally oxidizing the semiconductor layer 20 (the intrinsic semiconductor layer 22), the gate dielectric film 30 is formed on the semiconductor layer 20. With a thermal oxidization step, impurities of the source layer 60 and the drain layer 50 are diffused in the intrinsic semiconductor layer 22 to some extent. Therefore, the $p^-$-type extension layer 65 is formed on a surface of the $p^+$-type source layer 60.

Although not shown, an n-type semiconductor layer having a low impurity concentration can be also formed on a surface side of the drain layer 50. Next, the material of the gate electrode 40 is deposited on the gate dielectric film 30.

Next, the material of the gate electrode 40 is processed by a lithography technique and the RIE method. As a result, a configuration shown in FIG. 18B can be obtained.

Thereafter, the TFET 300 shown in FIG. 14 is completed as the interlayer dielectric film 90, contacts (not shown), metal wires (not shown), and the like are provided.

According to the third embodiment, the gate electrode 40 is formed on the source layer 60 and the extension layer 65, and not on the low-concentration layer 70. That is, the gate electrode 40 is shifted to the source layer 60 and the extension layer 65. For this reason, an electric field of the gate electrode 40 is not applied to the low-concentration layer 70 and thus does not modulate an energy band of the low-concentration layer 70. Therefore, BTBT from the source layer 60 to the low-concentration layer 70 is suppressed.

The bottom surface of the gate electrode 40 faces the source layer 60 via the extension layer 65. Accordingly, when a voltage is applied to the gate electrode 40, the extension layer 65 below the gate electrode 40 is depleted. As a result, BTBT in which the extension layer 65 is a start point is also suppressed.

A tunneling path of BTBT is a very short path from the source layer 60 to the extension layer 65 near the gate electrode 40. For this reason, the TFET 300 can obtain current voltage characteristics that exhibit very sharp SS characteristics. As a result, a circuit using the TFET 300 according to the third embodiment becomes a circuit with low power consumption.

Fourth Embodiment

Figure 19:
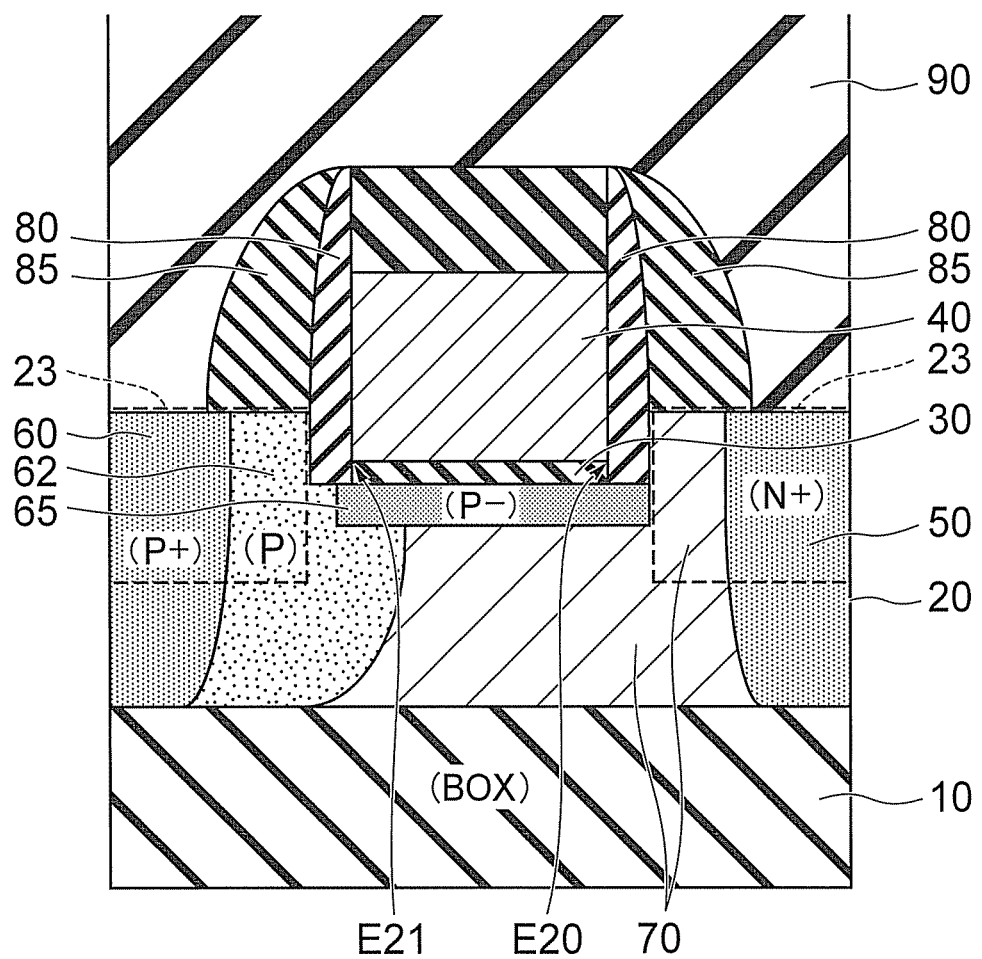
FIG. 19 is a cross-sectional view of an example of a configuration of an n-type TFET 400 according to a fourth embodiment.

FIG. 19 is a cross-sectional view of an example of a configuration of an n-type TFET 400 according to a fourth embodiment. The TFET 400 according to the fourth embodiment includes the BOX layer 10, the semiconductor layer 20, the gate dielectric film 30, the gate electrode 40, the drain layer 50, the high-concentration source layer 60, an intermediate-concentration source layer 62, the extension layer 65, the low-concentration layer 70, the sidewall insulation film 80, the spacer 85, and the interlayer dielectric film 90. The semiconductor layer 20 is not limited to an SOI layer provided on the BOX layer 10, and can be the same as the semiconductor layer 20 according to the first embodiment. A broken line area of FIG. 19 is the epitaxial layer 23 formed on an SOI layer as the semiconductor layer 20. The material of the epitaxial layer 23 can be different from that of the SOI layer. For example, the epitaxial layer 23 is made of silicon, germanium, or $Si_{1-X}Ge_X$. Because the epitaxial layer 23 is also made of a semiconductor material, the epitaxial layer 23 is explained below as a part of the semiconductor layer 20. That is, the semiconductor layer 20 is the SOI layer provided on the BOX layer 10 and the epitaxial layer 23.

The gate dielectric film 30 is provided on the semiconductor layer 20. The material of the dielectric film 30 can be the same as that of the gate dielectric film 30 according to the first embodiment.

The gate electrode 40 is provided via the gate dielectric film 30 on the semiconductor layer 20. The gate electrode 40 is formed on the extension layer 65. That is, the entire bottom surface of the gate electrode 40 faces the extension layer 65 via the gate dielectric film 30. However, according to the fourth embodiment, the entire bottom surface of the gate electrode 40 is not placed above the source layer 60, and a part of the bottom surface of the gate electrode 40 is placed above the low-concentration layer 70. The material of the gate electrode 40 can be the same as that of the gate electrode 40 according to the first embodiment.

The $n^+$-type drain layer 50 is provided within the semiconductor layer 20 on a side of one end part E20 of the gate electrode 40. The drain layer 50 is not provided immediately below the gate electrode 40, and is separated from the gate electrode 40. That is, the drain layer 50 is provided to be offset from the gate electrode 40. Therefore, the bottom surface of the gate electrode 40 does not face the drain layer 50.

The $p^+$-type high-concentration source layer 60 is provided on the semiconductor layer 20 on a side of the other end part E21 of the bottom surface of the gate electrode 40. The high-concentration source layer 60 is not also provided immediately below the gate electrode 40, and is separated from the gate electrode 40.

The p-type intermediate-concentration source layer 62 is provided on the semiconductor layer 20 so as to be adjacent to the high-concentration source layer 60 and the extension layer 65 or the low-concentration layer 70. The intermediate-concentration source layer 62 faces a part of the bottom surface of the gate electrode 40 via the gate dielectric film 30 and the extension layer 65. The impurity concentration of the intermediate-concentration source layer 62 is lower than that of the high-concentration source layer 60.

The $p^-$-type extension layer 65 is provided on the surface of the semiconductor layer 20 so as to face the entire bottom surface of the gate electrode 40 via the gate dielectric film 30. The impurity concentration of the extension layer 65 is lower than those of the intermediate-concentration source layer 62 and the high-concentration source layer 60. Accordingly, the concentration of a p-type impurity is gradually reduced over the source layers 60 and 62 and the extension layer 65.

The low-concentration layer 70 is provided between the drain layer 50 and the extension layer 65 or the intermediate-concentration source layer 62 within the semiconductor layer 20.

The sidewall insulation film 80, the spacer 85, and the interlayer dielectric film 90 can be the same as those of the second embodiment. Although not shown, a wiring configuration that is constituted by contacts, metal wires, interlayer dielectric films, and the like is further provided within the interlayer dielectric film 90 or on the interlayer dielectric film 90.

According to the TFET 400 of the fourth embodiment, the entire gate electrode 40 is provided on the extension layer 65. The extension layer 65 contains an impurity having the same conductivity type as that of the source layer 60. Furthermore, the low-concentration layer 70 is separated from the bottom surface of the gate electrode 40 by the gate dielectric film 30 and the extension layer 65. Therefore, BTBT degrading SS characteristics, in which the low-concentration layer 70 is a start point, hardly occurs.

In a case where the extension layer 65 has a low concentration (for example, has an impurity concentration of $10^{19}$ $cm^{-3}$ or less) and is thin (shallow), when a gate bias is applied thereto, a depletion layer extends to the bottom of the extension layer 65. For this reason, BTBT in which the extension layer 65 is a start point also does not occur.

Furthermore, the extension layer 65 also separates a junction part between the intermediate-concentration source layer 62 and the low-concentration layer 70 from the gate electrode 40. Therefore, BTBT from the intermediate-concentration source layer 62 to the low-concentration layer 70 is also suppressed. In this manner, the TFET 400 according to the fourth embodiment becomes an on-state mainly due to BTBT from the intermediate-concentration source layer 62 (or the high-concentration source layer 60) to the extension layer 65. Accordingly, the fourth embodiment can achieve effects identical to those of the first embodiment.

Further, according to the fourth embodiment, the drain layer 50 is not provided immediately below the gate electrode 40, and is offset from a channel part. Therefore, off-leakage can be reduced also in the fourth embodiment.

FIGS. 20A to 24B are cross-sectional views of a manufacturing method of the TFET 400 according to the fourth embodiment.

Figure 20A:
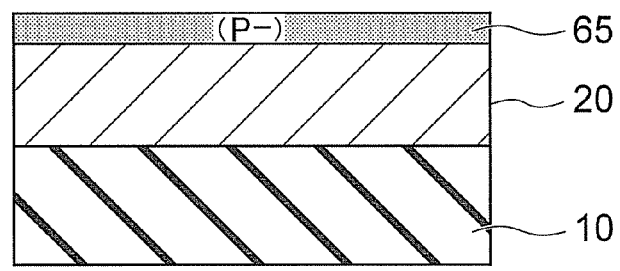
FIGS. 20A to 24B are cross-sectional views of a manufacturing method of the TFET 400 according to the fourth embodiment.

First, as shown FIG. 20A, silicon that contains low-concentration boron is epitaxially grown on the semiconductor layer 20. As a result, the extension layer 65 is formed.

Figure 20B:
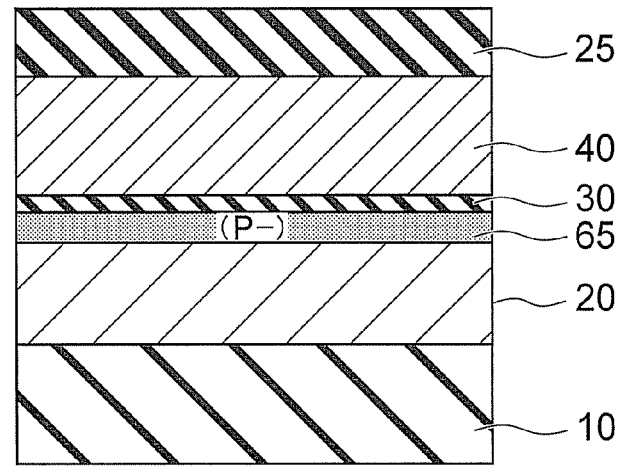

Next, as shown in FIG. 20B, the gate dielectric film 30 and materials of the gate electrode 40 and the hard mask 25 are formed on the extension layer 65. The gate dielectric film 30 and the material of the gate electrode 40 can be the same as those of the first embodiment.

Figure 21A:
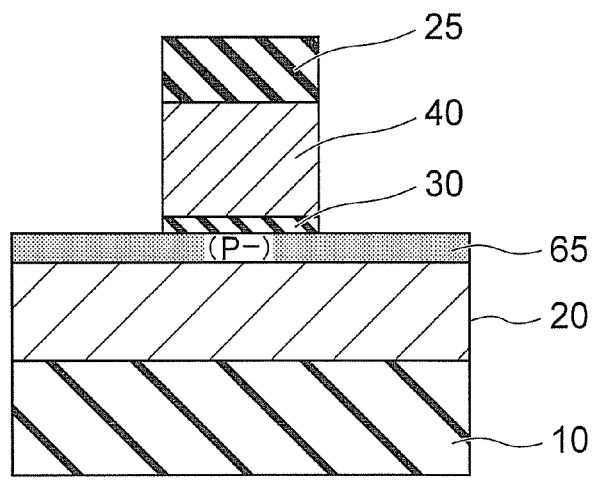

Next, the hard mask 25 is processed in a layout pattern of the gate electrode 40 by a lithography technique and the RIE method. While the hard mask 25 is used as a mask, the material of the gate electrode 40 and the gate dielectric film 30 are etched by the RIE method. As a result, as shown in FIG. 21A, the gate electrode 40 is formed.

Figure 21B:
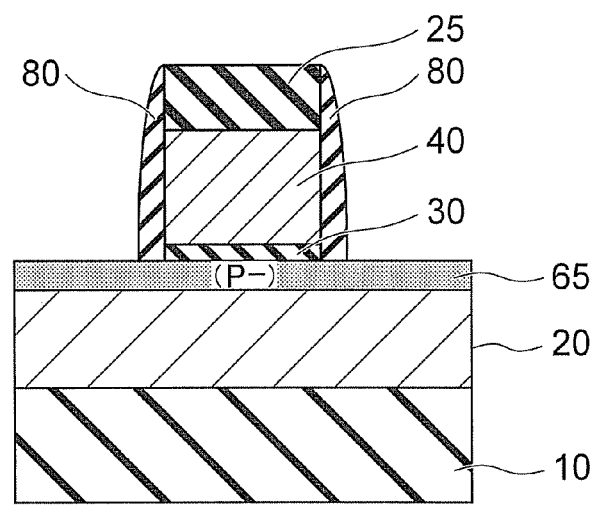

Next, after the material of the sidewall insulation film 80 (for example, TEOS) is deposited, the material of the sidewall insulation film 80 is anisotropically etched back by the RIE method. In this manner, as shown in FIG. 21B, the sidewall insulation film 80 is formed on a side surface of the gate electrode 40.

Figure 22A:
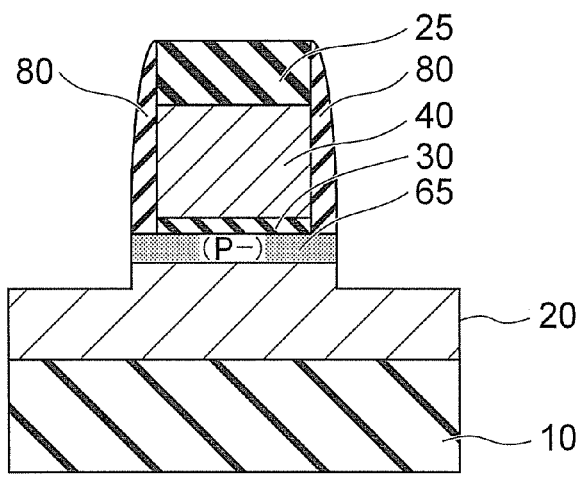
Figure 22B:
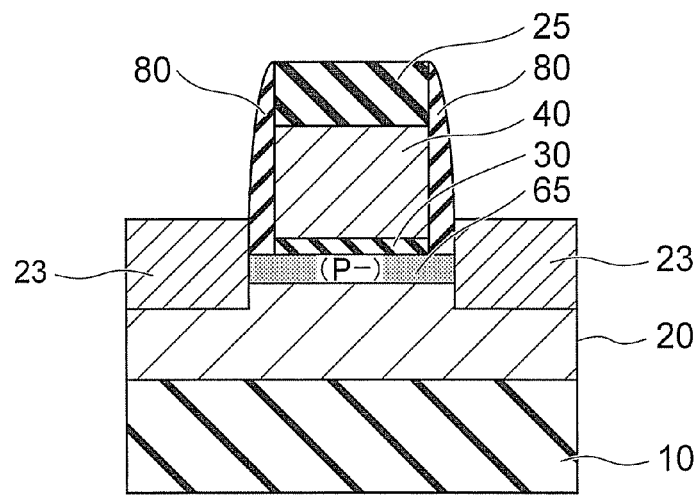

Next, as shown in FIG. 22A, while the hard mask 25 and the sidewall insulation film 80 are used as a mask, the extension layer 65 and an upper part of the semiconductor layer 20 are etched by the RIE method.

Next, the epitaxial layer 23 is selectively grown on an exposed surface and an exposed side surface of the semiconductor layer 20 by the epitaxial CVD method. The epitaxial layer 23 is preferably made of, a single crystal such as germanium or a mixed crystal such as SiGe. In this manner, on a side of the end part E21 of the gate electrode 40, at least parts of the high-concentration source layer 60 and the intermediate-concentration source layer 62 are made of a semiconductor material having a narrower band gap than that of silicon in the extension layer 65. Therefore, tunneling efficiency from the intermediate-concentration source layer 62 or the high-concentration source layer 60 to the extension layer 65 can be improved.

Figure 23A:
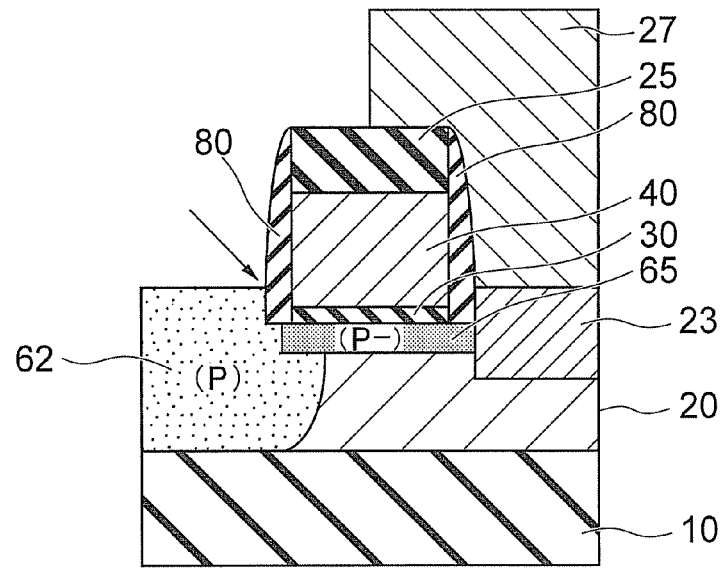

Next, an area where the drain layer 50 is formed is covered by the photoresist 27 using a lithography technique as shown in FIG. 23A. While the photoresist 27 is used as a mask, a p-type impurity (for example, B or $BF_2$) is implanted in an area where the source layer 60 is formed. At this time, the impurity is implanted from a direction that is inclined to the surface of the semiconductor layer 20 (the epitaxial layer 23) downward toward the gate electrode 40. As a result, the intermediate-concentration source layer 62 is formed. The impurity concentration of the intermediate-concentration source layer 62 is higher than that of the extension layer 65, but is lower than that of the high-concentration source layer 60 that is formed later.

Figure 23B:
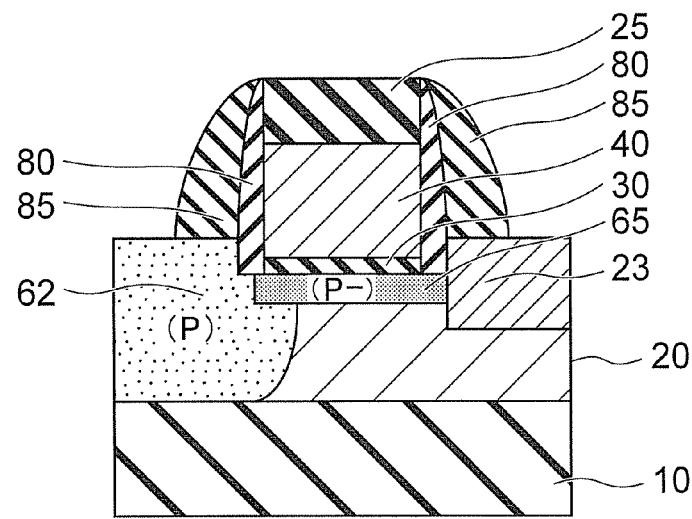

After the photoresist 27 is removed, the material of the spacer 85 (for example, TEOS) is deposited. By etching back the material of the spacer 85 by the RIE method, as shown in FIG. 23B, the spacer 85 remains on a side surface of the sidewall insulation film 80.

Figure 24A:
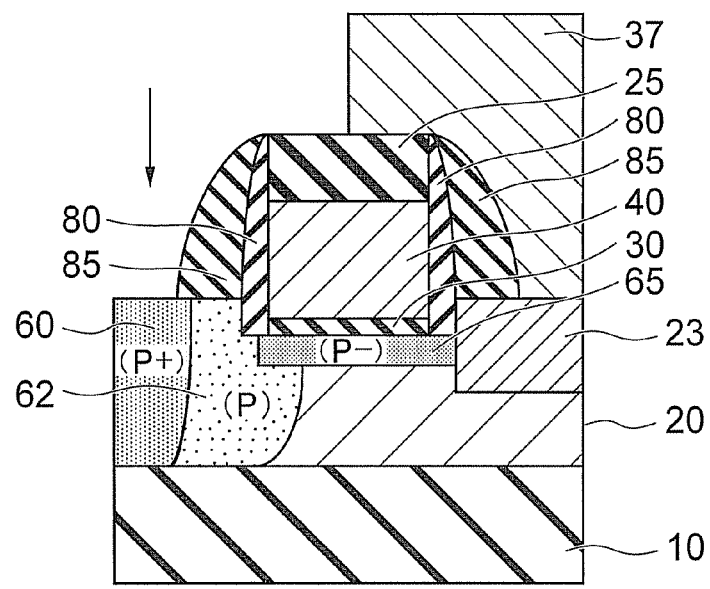

Next, as shown in FIG. 24A, the area where a drain layer is covered by the photoresist 37 using a lithography technique. While the photoresist 37 and the spacer 85 are used as a mask, a p-type impurity (for example, B or $BF_2$) is implanted in the area where the high-concentration source layer 60 is formed. At this time, as shown in FIG. 24A, the impurity is implanted from a direction that is substantially vertical to the surface of the semiconductor layer 20 (the epitaxial layer 23). To reduce the resistance of the high-concentration source layer 60, the impurity is implanted at a relatively high concentration.

Figure 24B:
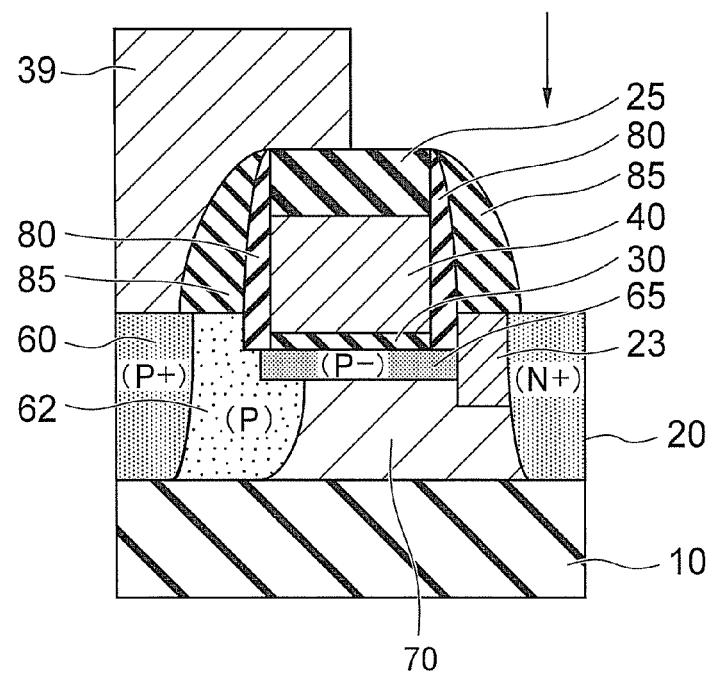

After the photoresist 37 is removed, as shown in FIG. 24B, the high-concentration source layer 60 is covered by the photoresist 39 using a lithography technique. While the photoresist 39 and the spacer 85 are used as a mask, an n-type impurity (for example, arsenic or phosphorus) is then implanted in the area where the drain layer 50 is formed. At this time, as shown in FIG. 24B, the impurity is implanted from a direction that is substantially vertical to the surface of the semiconductor layer 20 (the epitaxial layer 23). To reduce the resistance of the drain layer 50, the impurity is implanted at a relatively high concentration. At this time, because the spacer 85 is used as a mask, the drain layer 50 is not formed below the gate electrode 40, and is formed to be separated from the gate electrode 40. The epitaxial layer 23 between the gate electrode 40 and the drain layer 50 functions as a part of the low-concentration layer 70. Accordingly, the low-concentration layer 70 is interposed between the gate electrode 40 and the drain layer 50.

After the photoresist 39 is removed, activation annealing such as RTA is performed. As a result, the drain layer 50, the high-concentration source layer 60, the intermediate-concentration source layer 62, and the extension layer 65 are activated.

Thereafter, the TFET 400 shown in FIG. 19 is completed as the interlayer dielectric film 90, contacts (not shown), metal wires (not shown), and the like are provided.

According to the fourth embodiment, a tunneling distance of BTBT is shorter than that of a conventional planer-type TFET. For this reason, the TFET 400 can obtain current voltage characteristics that exhibit sharp SS characteristics. As a result, a circuit using the TFET 400 according to the fourth embodiment becomes a circuit with low power consumption.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a gate electrode;
   a semiconductor layer opposing to a bottom surface and a side surface of the gate electrode;
   an insulation film provided between the bottom surface of the gate electrode and the semiconductor layer and between the side surface of the gate electrode and the semiconductor layer;
   a first conduction-type drain layer provided in the semiconductor layer on a side of an end part of one of the bottom surface and the side surface of the gate electrode;
   a second conduction-type source layer provided in the semiconductor layer opposing to the other one of the bottom surface and the side surface of the gate electrode; and
   a second conduction-type extension layer provided in the semiconductor layer opposing to a corner part between the side surface of the gate electrode and the bottom surface of the gate electrode, the extension layer having a lower impurity concentration than that of the source layer, wherein the extension layer faces a part of the bottom surface of the gate electrode via the insulation film, and also faces a part of the side surface of the gate electrode via the insulation film.

2. The device of claim 1, further comprising a low-concentration layer provided in the semiconductor layer between the drain layer and the extension layer, the low-concentration layer having a lower impurity concentration than those of the drain layer, the source layer, and the extension layer, wherein the extension layer is provided between the source layer and the low-concentration layer.

3. The device of claim 2, wherein the source layer faces the side surface of the gate electrode via the insulation film, and the drain layer is provided on a side of an end part of the gate electrode that is on a side opposite to the source layer.

4. The device of claim 3, wherein an entire bottom surface of the gate electrode opposing to the semiconductor layer faces the extension layer or the low-concentration layer via the insulation film.

5. The device of claim 3, wherein the source layer comprises a shallow part facing the side surface of the gate electrode and a deep part separated from the side surface of the gate electrode.

6. The device of claim 3, wherein at least a part of an area where the source layer is formed is made of a semiconductor material having a narrower energy band gap than that of at least a part of an area where the extension layer is formed.

7. The device of claim 1, wherein the source layer faces the bottom surface of the gate electrode via the insulation film, and the drain layer faces the side surface of the gate electrode via the insulation film.

8. The device of claim 7, wherein the drain layer faces an upper part of the side surface of the gate electrode, and the source layer faces the bottom surface of the gate electrode on a side of an end part of the gate electrode that is opposite to the corner part.

9. The device of claim 1, wherein the insulation film has an L-shaped cross-section so as to be bent along the corner part of the gate electrode.

10. The device of claim 1, wherein a channel part of the semiconductor layer opposing to the gate electrode has an L-shaped cross-section so as to be bent along the corner part of the gate electrode.

11. The device of claim 1, wherein the corner part of the gate electrode has a substantially right angle, and the insulation film is bent at a substantially right angle.

12. The device of claim 1, wherein an entire top surface of the extension layer faces the bottom surface or the side surface of the gate electrode via the insulation film.

* * * * *